United States Patent [19]
McIntosh et al.

[11] Patent Number: 6,151,967
[45] Date of Patent: Nov. 28, 2000

[54] WIDE DYNAMIC RANGE CAPACITIVE TRANSDUCER

[75] Inventors: Robert B. McIntosh, Alexandria, Va.;
Philip E. Mauger, Santa Clara, Calif.;
Steven R. Patterson, Concord, N.C.;
Gene A. Goodman, Rockville, Md.

[73] Assignee: Horizon Technology Group, Alexandria, Va.

[21] Appl. No.: 09/037,733

[22] Filed: Mar. 10, 1998

[51] Int. Cl.[7] .............................. G01P 15/125; G01L 9/12
[52] U.S. Cl. .................... 73/514.32; 73/514.18; 73/718; 361/283.4
[58] Field of Search ........................... 73/514.18, 514.32, 73/718, 724, 862.626; 361/278, 280, 283.4

[56] References Cited

U.S. PATENT DOCUMENTS

| | | | |
|---|---|---|---|
| 3,993,939 | 11/1976 | Slavin et al. | 73/724 |
| 4,225,755 | 9/1980 | Block | 179/111 |
| 4,360,955 | 11/1982 | Block | 29/25 |
| 4,584,885 | 4/1986 | Cadwell | 73/862 |
| 4,829,826 | 5/1989 | Valentin et al. | 73/718 |
| 4,996,627 | 2/1991 | Zias et al. | 361/283 |
| 5,019,783 | 5/1991 | Cadwell | 324/662 |
| 5,048,165 | 9/1991 | Cadwell | 29/25 |
| 5,801,313 | 9/1998 | Horibata et al. | 73/514.32 |

OTHER PUBLICATIONS

Basarab–Horwath et al., "Capacitance transducer using a thin dielectric and variable–area electrode", IEE Proc., vol. 127, PT.A, No. 6, Jul. 1980, pp. 392–393.

Carter et al., "Measurement of Displacement and Strain by Capacity Methods", Proc. J. Mech. E. (152) 1945, pp. 215–221.

*Primary Examiner*—John E. Chapman
*Attorney, Agent, or Firm*—Alfred F. Hoyte, Jr.

[57] ABSTRACT

A variable area capacitor with a flexible electrode responsive to a physical effect and a rigid electrode with a predetermined surface contour. The surface contour is dimensioned to provide a specific change in capacitance with deflection of the flexible electrode. A thin dielectric layer maintains a substantially fixed spacing between the two electrodes. Preferred embodiments include a pressure sensor, microphone and accelerometer. A differential transconductance amplifier detects changes of the variable capacitor in a low-impedance, bridge-like circuit and feeds back current to balance the bridge. The voltage that controls the feedback current is proportional to capacitance over a wide dynamic range.

36 Claims, 13 Drawing Sheets

| RADIUS (mm) | $y_1(r)$ | $y_2(r)$ |
|---|---|---|
| 0.0 | 71.700 | 71.700 |
| 0.2 | 71.490 | 71.521 |
| 0.4 | 70.864 | 70.985 |
| 0.6 | 69.828 | 70.098 |
| 0.8 | 68.395 | 68.867 |
| 1.0 | 66.580 | 67.303 |
| 1.2 | 64.406 | 65.421 |
| 1.4 | 61.898 | 63.239 |
| 1.6 | 59.086 | 60.776 |
| 1.8 | 56.002 | 58.056 |
| 2.0 | 52.683 | 55.104 |
| 2.2 | 49.170 | 51.949 |
| 2.4 | 45.503 | 48.621 |
| 2.6 | 41.728 | 45.154 |
| 2.8 | 37.890 | 41.581 |
| 3.0 | 34.035 | 37.940 |
| 3.2 | 30.212 | 34.268 |
| 3.4 | 26.466 | 30.604 |
| 3.6 | 22.844 | 26.988 |
| 3.8 | 19.388 | 23.459 |
| 4.0 | 16.139 | 20.058 |
| 4.2 | 13.135 | 16.822 |
| 4.4 | 10.409 | 13.790 |
| 4.6 | 7.987 | 10.998 |
| 4.8 | 5.890 | 8.478 |
| 5.0 | 4.129 | 6.260 |
| 5.2 | 2.709 | 4.367 |
| 5.4 | 1.622 | 2.818 |
| 5.6 | 0.849 | 1.621 |
| 5.8 | 0.357 | 0.773 |
| 6.0 | 0.099 | 0.258 |
| 6.2 | 0.009 | 0.032 |

*FIG. 8A*

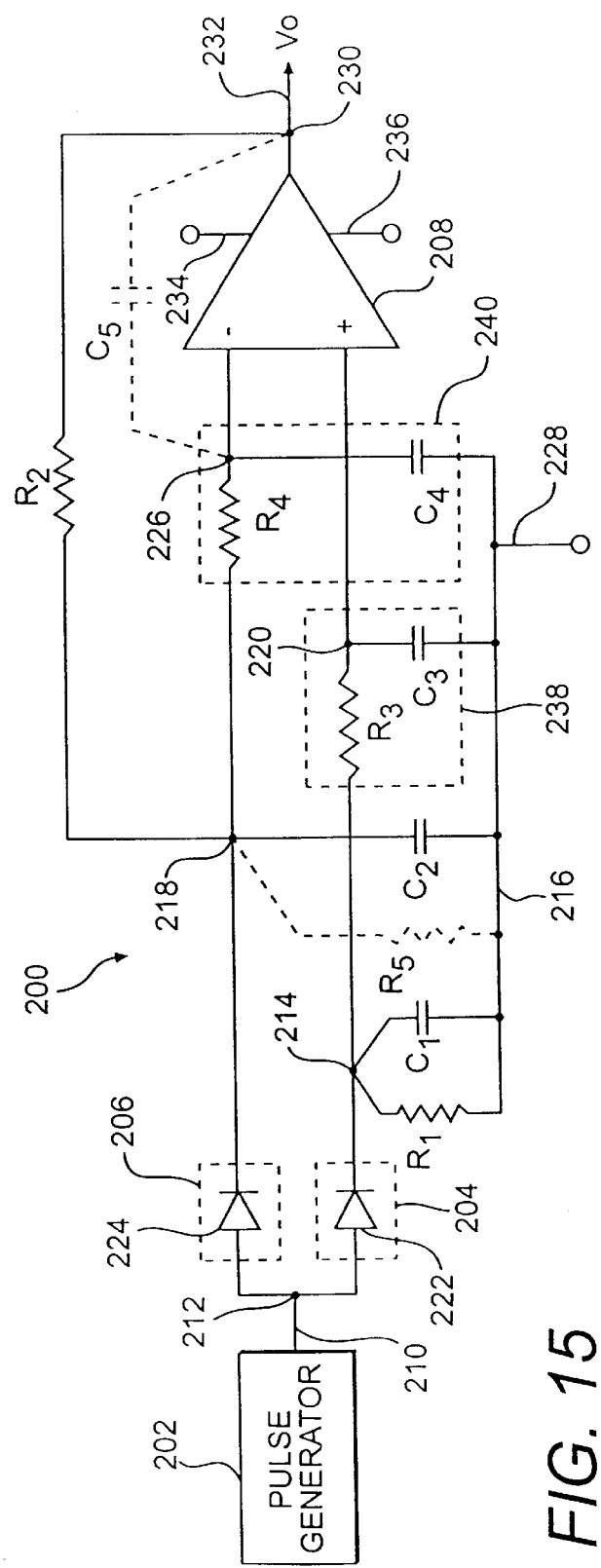
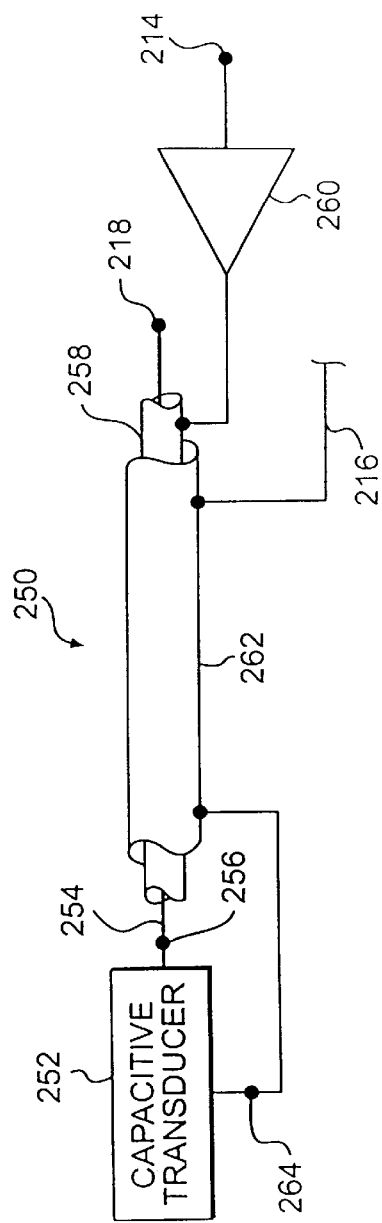
FIG. 15
FIG. 16

WIDE DYNAMIC RANGE CAPACITIVE TRANSDUCER

FIELD OF THE INVENTION

The present invention relates in general to capacitive transducers and particularly to improved capacitive transducers configured to sense force, pressure, strain, vibration, acceleration, gravity, sound, mechanical displacement, electric charge, radiation, and fluid flow. One aspect of the present invention relates to an improved capacitive detection circuit with a linear response over a wide linear dynamic range to transduce the very large capacitance changes of the variable capacitor of the present invention.

BACKGROUND OF THE INVENTION

Capacitive transducers with a flexible sensing diaphragm convert an applied force, pressure, or physical displacement to a change in capacitance. This capacitive change is transduced by an electrical circuit to a corresponding change in electrical voltage, current, or frequency. Prior art capacitive transducers use substantially parallel-plate electrodes separated a small distance apart in vacuum or a fluid dielectric medium. The sensitivity, linearity, and dynamic range of capacitive transducers is limited by the disadvantages of such variable parallel-plate capacitors.

When fringe fields are ignored, the capacitance C between two, conducting parallel plates is substantially given by:

$$C = \in A/d,$$

where $\in$ is the permittivity of the dielectric medium, A is the effective area of the capacitor plates, and d is the effective spacing between the capacitor plates. Capacitance-displacement sensitivity, the change in capacitance as a function of plate spacing, is given by:

$$\Delta C/\Delta d = -\in A/d^2$$

which has a dependency on $d^2$ which results in a non-linear increase in capacitance sensitivity with decreasing plate spacing.

The capacitance-displacement sensitivity of a transducer with substantially parallel plates also can be affected by:

1. the non-linear reduction in capacitive sensitivity due to bending stresses in the sensing plate when the ratio of plate deflection to plate thickness is substantially greater than 0.2;

2. the non-linear reduction in capacitive sensitivity due to tensile stresses arising from the stretching of a thin sensing plate or diaphragm; and, 3 the reduction in capacitive sensitivity and frequency response due to viscous damping when a fluid dielectric, such as air, is squeezed between the capacitor plates.

U.S. Pat. No. 5,048,165 issued Sep. 17, 1991, discloses a method to construct a capacitive transducer with a deformable plate located between two, rigid plates. Differential capacitance detection allows two different and oppositely-sensed non-linearities to cancel to extend the linear range of the transducer. The disadvantage of this method is the complexity of using an additional capacitor plate and the requirement to construct a three-plate capacitive structure with well known, closely maintained and matched mechanical, thermal, and electrical characteristics.

U.S. Pat. No. 4,996,627 issued Feb. 26, 1991, discloses a three-plate, capacitance transducer used with an electronic circuit disclosed in U.S. Pat. No. 5,019,783 issued May 28, 1991, to provide a linear electrical output for a transducer with intrinsic non-linear sensitivity. U.S. Pat. 4,584,885 issued Apr. 29, 1986, discloses another of the many electronic circuits devised to electrically linearize the outputs of capacitive transducers. The disadvantages of these approaches is the requirement to use a third capacitor plate and the complexity and cost of signal compensation electronics. A general disadvantage of using mechanical or electrical methods to linearize the response of a capacitive transducer with substantially parallel-plate electrodes is that the sensitivity and dynamic range of the transducer cannot be significantly increased.

Other disadvantages and limitations of prior-art capacitive transducers arise from low values of quiescent capacitance. The maximum quiescent capacitance of a capacitive transducer is determined by the minimum spacing that can be reliably maintained between parallel-plate electrodes. Plate spacing is limited by the dimensional tolerances and stability of precision components and support structure. Plate spacing can also be limited by the voltage applied across the electrodes.

For microphones and capacitance transducers with thin sensing diaphragms, electrode spacing is further restricted by the space required to accommodate diaphragm displacement. As an example, a Bruel & Kjaer Model 41444, one-inch diameter, research-grade, capacitive microphone maintains a nominal 20-micron gap between a thin, nickel diaphragm and a rigid back-plate electrode. This spacing limits microphone capacitance to typically 55 pF and requires the device to be constructed from thermally stable components with precision tolerances. A 20-micron, dielectric gap is 100 to 1000 times larger that the thickness of dielectric films, such as silicon dioxide and silicon nitride, that are used to construct integrated circuit devices.

Low values of quiescent capacitance $C_o$ in capacitive transducers can cause a loss in sensitivity due to parallel stray capacitance. The total stray capacitance $C_s$ of support structure, electrodes, conducting leads, and the inputs of electronic circuits that shunts the quiescent capacitance reduces sensitivity by a factor $C_o/(C_o+C_s)$. Stray capacitance is of particular concern for transducers constructed with small, micromachined components and thin material layers. Low-capacitance transducers are more susceptible to electromagnetic interference and to changes in stray capacitance compared to transducers with higher quiescent capacitance.

Another disadvantage of transducers with parallel-plate capacitors is the increased noise in electrical networks with small capacitors. It is well known that the mean-squared voltage fluctuation, $\Delta V^2$ of a system with a capacitor at thermal equilibrium equals kT/C where k is Boltzmann's constant and T is absolute temperature. This noise source limits the accuracy and dynamic range of a capacitive transducer when it exceeds fundamental noise resulting from thermally induced motion of the sensing diaphragm.

Yet another disadvantage of a parallel-plate capacitive transducer, with a thin sensing diaphragm, is the maximum voltage that can be safely applied across the capacitor plates. Large displacements of a thin diaphragm resulting from shock or over-pressure loads can cause the diaphragm to collapse against its counter electrode. This occurs when the diaphragm deflects to a position where electrostatic force overcomes the mechanical restoring force of the diaphragm.

Capacitive transducers used to measure acceleration frequently use electrostatic force-feedback to maintain a suspended proof mass in a substantially fixed location. This minimizes non-linear capacitance sensitivity with electrode spacing. However, feedback cannot increase capacitance sensitivity or overcome the disadvantages of small quiescent capacitance limited by practical electrode spacing.

A variable capacitor has linear response if the area of the capacitor plates are changed while the plate spacing remains fixed. This can be accomplished by moving or rotating multiple plates in parallel planes. This approach was used to capacitively tune early radios, but is difficult to implement in small transducers.

An article titled "A capacitor transducer using a thin dielectric and variable-area electrode" appearing in the IEE Proc., Vol. 127, Pt. A, No. 6, July 1980, by Basarab-Horwath et al., reports high values of capacitive sensitivity for a transducer with capacitor plates that increase in area with applied force. The disadvantage of this transducer is that the shape of the flexible electrode changes with both displacement and applied loading. Therefore, it is difficult to obtain, maintain, and control a precision capacitance relationship between the electrodes. This article does not teach or suggest the benefits of using a rigid electrode with a surface contour chosen to obtain an accurate, repeatable, and specific capacitive relationship between the electrodes of a variable capacitor or a capacitance transducer.

The work by Basarab-Horwath et. al. is reported as an extension of the work by Caterer et al. described in "Measurement of Displacement and Strain by Capacity Methods", Proc. J. Mech. E., (152) 1945. Carter et al. describe a variable capacitor with a tangential strip electrode that deforms in an arc around an electrode of cylindrical cross-section. This article does not teach or suggest the benefits of using the larger surface perimeter of a diaphragm or plate to obtain higher values of capacitance sensitivity or how to linearize capacitance sensitivity for flexible electrodes with different deflection-load response characteristics. This type of variable capacitor also has the disadvantage of not having integral, self-supporting components in a compact and rigid assembly.

U.S. Pat. No. 4,225,755, issued Sep. 30, 1980, discloses two embodiments of a capacitive force transducer primarily for use as a microphone. A first embodiment comprises a thin metal diaphragm held in contact to a dielectric film on a metal electrode having a lip of cylindrical cross-section. A second embodiment comprises a thin conducting diaphragm suspended over dielectric material adhered to an electrode that is anisotropically etched from crystalline material. An advantage attributed to the two embodiments is small quiescent capacitance. The capacitance of the second embodiment is too small to be practically utilized in a transducer as it is severely limited by the large angle that exits between the <100> and <111> planes of a crystalline material with cubic diamond crystal structure. This invention does not teach or suggest the advantages of electrodes contoured to provide high values of quiescent capacitance and correspondingly high values of capacitance sensitivity. This patent and an associated patent, U.S. Pat. No. 4,360,955, issued Nov.30, 1982, also do not teach or suggest the benefits of using a rigid electrode with a specific surface contour to control capacitive sensitivity with diaphragm deflection, to maximize the linear dynamic range of the transducer, or to linearize capacitive sensitivity for flexible electrodes with different deflection-load response characteristics.

Accordingly, the present invention was developed to provide a capacitor transducer with high capacitive sensitivity that is governed by the rate of change of the effective area of the capacitor electrodes; that is independent of electrode spacing; and that has the advantages of the narrow electrode spacing provided by a thin film dielectric spacer.

Many electronic circuits have been devised to transduce the changes of a variable capacitor. The most sensitive and stable circuits utilize ratiometric bridge networks, but none are known to have the low-noise, high sensitivity, and wide linear dynamic range to fully exploit the performance capabilities of the variable capacitor of the present invention. This capability can be realized if a capacitive detection circuit can be devised that has in combination the following features and performance capabilities:

a. a circuit arrangement with a ratiometric bridge-like network to detect small differences in the capacitance between a variable capacitor and a stable reference capacitor;

b. a circuit in which a transconductance amplifier feeds back current to null a bridge network for large capacitance changes.

c. a feedback circuit with a linear output voltage which allows one electrode of a variable capacitor to be grounded;

d. a feedback circuit that is stable at low values of closed-loop gain to accommodate large capacitive changes up to 1000% and more;

e. a circuit having a wide linear dynamic range of 120 dB, and more, at low frequencies down to DC;

f. a low-impedance, circuit arrangement that minimizes thermal noise of passive components and the voltage and current noise of an amplifier used for closed-loop bridge balancing;

g. a circuit with differential loss-pass filtering before amplification;

h. a circuit with an amplifier for which the input impedance, dynamic response, bandwidth, and common-mode rejection of the inverting and non-inverting inputs are substantially identical;

i. a bridge-like network that minimizes signal division by fixed elements and uses the majority of the time during an excitation cycle to develop a measurement signal;

j. a circuit that can to operate from a single, low-voltage power supply or from higher-voltage, bipolar supplies;

k. a circuit for which active shielding can be easily implemented.

Prior art capacitive detection circuits do not have a combination of all the above advantages. For example, circuits that use voltage feedback to achieve a linear response generally do not have low-impedance circuitry or allow one electrode of a variable capacitor to be grounded. Low-impedance circuits have a linear response over a very limited range.

Accordingly, the instant invention was developed to provide a capacitance detection circuit with the above features and capabilities to enhance the sensitivity, accuracy, and dynamic range of many different types of capacitance transducers, and specifically to fully exploit the performance capability of transducers using a variable capacitor of the present invention.

SUMMARY OF THE INVENTION

A general object of the present invention is to enhance the performance characteristics of capacitive transducers.

Another object of the present invention is to provide capacitive transducers with more accurate and linear outputs over a wider dynamic range than is possible with prior-art capacitive transducers using parallel-plate electrode arrangements to sense force, pressure, strain, vibration, acceleration, gravity, sound, mechanical displacement, electric charge, radiation, fluid flow, or other physical effects.

Another object of the present invention is to provide an apparatus to govern the capacitance relationship between a flexible electrode responsive to a physical effect and a rigid counter-electrode with a predetermined surface contour. The shape of the rigid electrode is selected to achieve a specific output characteristic from a variable capacitor or a capacitor transducer. One such characteristic can be maximum linear dynamic range over a specified fill-scale range of an applied input. Another such characteristic is to provide, for example, a linear increase in the effective area of the capacitance electrodes with deflection of the flexible electrode. Still another such characteristic is to provide an output that compensates for non-linear bending and tensile stresses in a flexible electrode and other non-linear effects that may exist in capacitance transducer electronic systems.

Other objects and advantages of the variable capacitor of the present invention include:

a. an intrinsically linear output that does not require a third electrode or additional electronic circuitry to linearize capacitance sensitivity.

b. high values of active quiescent capacitance to reduce losses in sensitivity and dynamic range due to stray capacitances and electrical noise. High values of quiescent capacitance also reduce transducer susceptibility to electromagnetic interference and changes in parasitic and stray capacitance.

c. a thin dielectric layer such as silicon dioxide or silicon nitride that can be reliably grown or deposited in substantially 20 to 200 nm thick layers by well established integrated circuit manufacturing methods.

d. an electrode configuration for which capacitance sensitivity and frequency response are not dampened by a fluid between the electrodes such as air.

e. a thin sensing diaphragm that is not vulnerable to electrostatic collapse.

f. an open electrode configuration that accommodates large deflections of the flexible electrode or deflections of a diaphragm with a integral hub.

g. a rigid electrode with a central aperture to allow fluid pressure to be applied to the backside of a sensing plate or diaphragm to allow measurements of differential pressure and fluid flow.

h. a flexible electrode fabricated from single-crystal silicon. Silicon is substantially free of hysteresis because of its extraordinary elastic properties and silicon diaphragms can be fabricated from silicon wafers with thicknesses down to one micron, or less. Thickness uniformity and the control of internal stress in silicon diaphragms is superior to metal foils.

Still another object of the present invention is to provide an improved force-balanced accelerometer having a rigid annular electrode with a predetermined surface contour to capacitively sense diaphragm displacement in response to force applied to a suspended proof mass. This allows the contoured electrode to be physically isolated from the capacitor plates used for closed-loop electrostatic force balancing and minimized cross-coupling of electrostatic fields. Physical separation of the contoured displacement sensing electrode and the force-balance capacitor plates also allows electrode gaps, electrostatic bias and control voltages, and position sensing excitation voltage to be independently specified for performance, construction, and packaging optimization.

A general object of another aspect of the present invention is to provide an improved capacitive detection circuit that has a linear output for very large changes of a variable capacitor compared to prior art capacitive sensing methods.

Another object of this aspect of the invention relates to an improved capacitive detection circuit that more accurately and more linearly measures differential capacitance changes over a wider dynamic range than by other know capacitance measurement methods.

In accordance with one embodiment of this aspect of the invention, a pulse generator, electrical isolation means, a bridge-like network, low-pass filters, and current feedback from a differential transconductance amplifier provide a linear output voltage for changes in capacitance with low levels of noise and drift at frequencies including DC.

Other objects and advantages of the capacitive detection circuit of the invention include:

a. A ratiometric bridge-like network that detects small differences in capacitance between a variable sensing capacitor and a fixed, stable reference capacitor, or alternatively between two variable capacitors. The use of a bridge minimizes errors associated with phase and timing variations of the bridge excitation waveform as well as errors arising from common-mode electromagnetic interference.

b. A circuit with a transconductance amplifier, or a voltage-controlled current source, to feed back current to null a ratiometric bridge network for changes in capacitance. The voltage used to control the feedback current being substantially linear with capacitance changes $\Delta C/C$ up to 1000% and higher;

c. A feedback circuit arrangement with a linear output that allows one electrode of a variable capacitor to be grounded, or alternatively one electrode of two variable capacitors to be grounded. Grounded electrodes minimize parasitic and stray capacitance that cause signal loss and electrical noise from capacitively coupled electrical fields. Grounding the variable capacitor element also eliminates the requirement for a separate signal return line between a capacitive transducer and its associated electronics.

d. A circuit with a stable output at low values of closed-loop gain that allows the detection of the very large changes of the variable capacitor.

e. A circuit with a low-noise output over a bandwidth from DC to the highest frequency at which capacitance changes are required to be detected.

f. A circuit with a bridge-like network that has two resistance arms that are lower in impedance than conventional capacitance bridge circuits with four capacitors. This reduces thermal noise and allows an operational amplifier to be selected that has a combined value of voltage noise and low-frequency flicker (1/f) voltage noise that is comparable to effective values of its current noise and low-frequency flicker (1/f) current noise. The use of low-impedance circuitry also reduces circuit susceptibility to electrical pickup and minimizes signal loss due to voltage division across stray capacitances. Another advantage of low-impedance circuitry is it limits low-frequency drift associated with thermally induced changes in bias currents in differential amplifiers.

g. A circuit in which the bridge-excitation frequency can be increased to megahertz levels to further reduce the impedance of the capacitive detection circuitry and the values of its bridge resistors.

h. A circuit with a differential transconductance amplifier for which the input impedance, dynamic response, bandwidth, and common mode rejection of the inverting and non-inverting inputs are substantially identical. A differential transconductance amplifier with active feedback also has the advantage of accommodating large differential and common mode input signals.

i. A circuit with low-pass filtering ahead of differential amplification to substantially reduce the fundamental and higher order frequencies of the bridge excitation voltages. This allows amplification and closed-loop control to be performed at only the highest required detection frequency, where amplifier gain and common-mode signal rejection are high compared to the bridge excitation frequency. Differential passive filtering also provides a substantially constant voltage to discharge the variable capacitor during a single, charge-discharge cycle.

j. A detection circuit that maximizes signals across variable capacitors and minimizes signal division across fixed bridge components, and one that uses the majority of the time during an excitation cycle to develop a differential capacitance measurement signal. The capacitive sensitivity of the capacitance detection circuit of the present invention, in terms of the change in output voltage $\Delta V$ for a given change in capacitance $\Delta C/C$ is comparable or higher than that of prior art bridge circuits. Since the bridge capacitors are charged to the peak potential of a short excitation pulse, a loss of one-half does not occur due to voltage division across substantially equal capacitors in adjacent arms of a bridge network. Also, the sensed capacitor and the reference capacitor are simultaneously charged during the a period of time $t_1$ that is short compared to the discharge time $t_2$. This increases the average value of the differential bridge output over repetitive measurement cycles.

k. A circuit that can operate from a single low-voltage power supply as well as from higher-voltage bipolar supplies to accommodate a broad range of capacitive-based measurement applications.

l. A circuit arrangement for which active shielding can be used to minimize noise and electrical pickup from stray electrical fields and to minimize signal loss across stray capacitance.

DESCRIPTION OF THE DRAWINGS

Further objects and advantages of the instant invention will become apparent from the following description of the preferred embodiments when read in conjunction with the appended drawings, wherein like reference characters generally designate similar parts or elements with similar functions throughout the various views, and in which:

FIG. 8A is a table of the coordinates of two different examples of surface contours of a rigid electrode of a capacitive transducer, in accordance with the present invention;

FIG. 15 is a circuit diagram of one preferred embodiment of the capacitive detection circuit of the present invention;

FIG. 16 is an illustration of a method of active shielding, as used in accordance with the present invention.

DETAILED DESCRIPTION OF THE PREFERRED EMBODIMENTS

Figure 1:
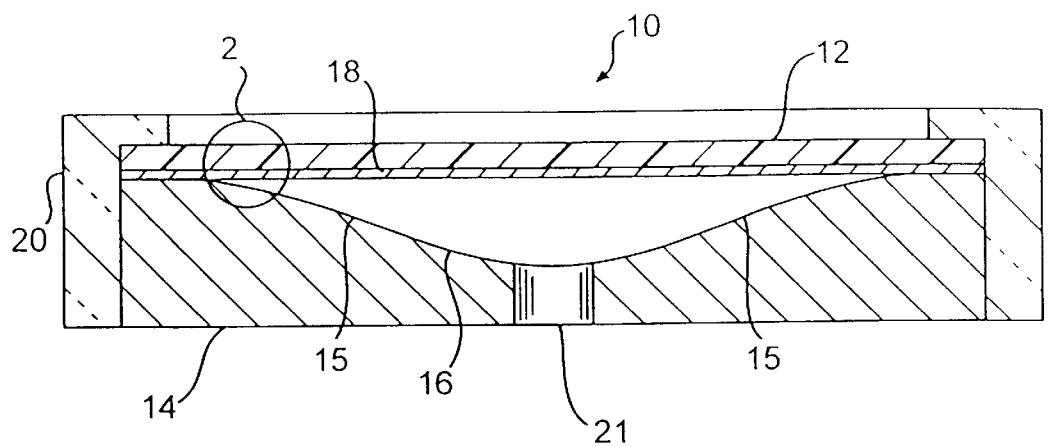
FIG. 1 is a simplified cross-sectional view of a variable capacitance apparatus with a flexible electrode responsive to a physical effect and a rigid electrode with a predetermined surface contour, in accordance with the present invention.

Referring to FIG. 1, there is shown, not to scale, a variable capacitor apparatus generally identified by reference numeral 10 that incorporates the features of the present invention. Apparatus 10 comprises a variable capacitor with flexible electrode 12 and rigid electrode 14. Flexible electrode 12 deflects in response to a force or pressure load arising from a physical effect. Rigid electrode 14 has a predetermined surface contour 16 facing flexible electrode 12. The dimensions of surface contour 16 are selected to provide a specific change of capacitance of variable capacitor apparatus 10 as a function of the deflection of flexible electrode 12. A thin dielectric spacer 18 maintains a substantially fixed spacing between rigid electrode 14 and flexible electrode 12 with deflection of flexible electrode 12. An electrically insulating support body 20 clamps flexible electrode 12 in a fixed electrically insulative relationship with rigid electrode 14. A hole 21 in rigid electrode 14 provides to path for pressure equalization.

Figure 2:
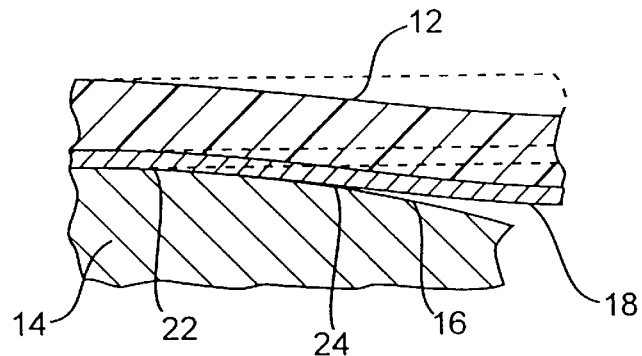
FIG. 2 shows an enlarged view of the portion of a variable capacitor apparatus of FIG. 1 designated by circle 2.

FIG. 2 shows an enlarged detail view of a portion of variable capacitor apparatus 10 of FIG. 1 delineated by circle 2. Flexible electrode 12 and dielectric spacer 18 contact rigid electrode 14 up to contact point 22 when no load exists. If flexible electrode 12 is a circular diaphragm, contact point 22 is a point on a circle of contact radius r. When a load deflects flexible electrode 12 and dielectric spacer 18, contact point 22 moves to new contact point 24. If flexible electrode 12 is a circular diaphragm, new contact point 24 is a point on a circle of contact radius r-$\Delta$r. Thereby the applied load increases the effective area A of variable capacitor apparatus 10 by $\Delta A = 2\pi r \Delta r$. The corresponding incremental increase in capacitance is $$\Delta C = \frac{\epsilon}{d} \cdot \Delta A.$$

Large values of C and $\Delta C$ can be realized because of the very thin dielectric spacer 18 compared to the much wider dielectric spacing between parallel-plate capacitor electrodes.

A linear change of capacitance with applied load L over a wide dynamic range is highly desirable for precision measurements. This requires $\Delta C/\Delta L$ to remain constant with increasing load. Since $$\frac{\Delta C}{\Delta L} = \frac{\Delta C}{\Delta A} \cdot \frac{\Delta A}{\Delta L}$$

and $\Delta C/\Delta A$ is substantially linear, surface contour 16 is selected to maintain $\Delta A/\Delta L$ constant. This maximizes the linear dynamic range of variable capacitor apparatus 10. Linearity is defined here as the closeness to which capacitance-load sensitivity $\Delta C/\Delta L$ as a function of applied load approximates a straight line.

A major advantage of the present invention is that surface contour 16 can be selected to compensate for the loss of sensitivity with large deflections of flexible electrode 12, thereby extending the linear dynamic range of variable capacitor apparatus 10. Large deflections give rise to non-linear bending stresses in thick electrodes and non-linear tensile stresses in very thin electrodes. Surface contour 16 can be selected to maximize the linear dynamic range of variable capacitor apparatus 10 in which:

a. the deflection of flexible electrode 12 in response to loading is primarily determined by bending stresses, as in pressure sensors, strain gauges, load cells, etc.

b. the deflection of flexible electrode 12 in response to loading is primarily determined by tensile stresses due to stretching, as in microphones, accelerometers, seismometers, gravimeters, vacuum gauges, fluid-flow sensors, Golay cells, electrometers, etc.

A surface contour 16 that maximizes the linear dynamic range of a specific electrode configuration can be modified to compensate for additional effects such as a nonlinear transfer function of an electronic circuit that transduce capacitance changes to an electrical signal.

In accordance with the present invention, a computer model is preferably used to calculate a specific surface contour 16 for rigid electrode 14 based on the following parameters:

a. The geometry of flexible electrode 12 and support body 20, b. The material properties of flexible electrode 12, typically Young's modulus, Poisson's ratio, yield strength, and burst strength, c. The force-deflection relationship of flexible electrode 12, d. A method to account for the changing boundary of the unsupported region of flexible electrode 12.

e. A numerical integration method to determine the effective capacitance between the generatrix of flexible electrode 12 and surface contour 16 of rigid electrode 14 given the material thickness and dielectric constant of intermediate dielectric spacer 18.

The object function of the computation used in the computer model is a surface contour 16 that provides a desired change in capacitance as a function of applied force. For example, a surface contour 16 can be chosen to maximize the linear dynamic range of variable capacitance apparatus 10 over a specified full-scale measurement range.

It is convenient to create an object function in a dimensionless form since capacitance-load sensitivity $\Delta C/\Delta L$ is substantially a function of the shape of surface contour 16 and not the overall size of flexible electrode 12. As a result, a linear response can be obtained with one surface contour shape over a range of diameters and thicknesses of flexible electrode 12. Capacitance-load sensitivity increases for a larger diameter or a thinner flexible electrode 12.

The shape of surface contour 16 in FIG. 1 is representative of a contour 16 that provides a substantially linear increase in effective electrode area with loading for a clamped, uniformly loaded, circular electrode with a generatrix primarily determined by bending stresses. The surface contour 16 is substantially a doubly curved surface with a characteristic inflection circle that includes point 15.

Figure 3:
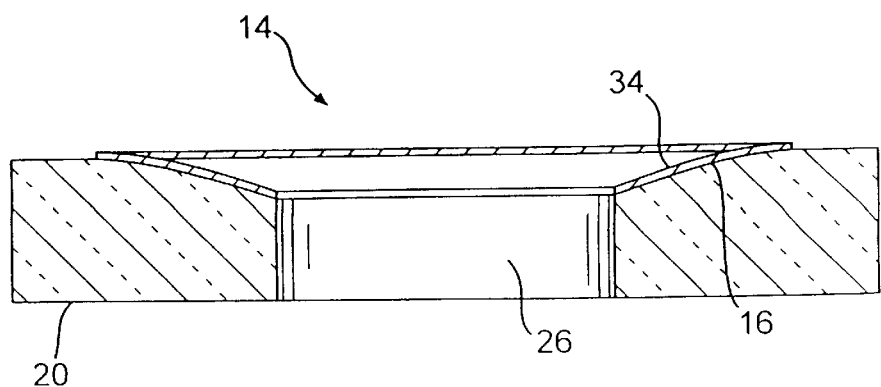
FIG. 3 shows a rigid capacitor electrode with a central aperture for differential pressure and fluid flow measurements, in accordance with the present invention.

FIG. 3 is a simplified cross-sectional view of a rigid electrode generally shown by reference numeral 14 for use in an alternate embodiment of variable capacitance apparatus 10 of FIG. 1. Rigid electrode 14 comprises metal film electrode 34 deposited to surface contour 16 fabricated in the top surface of insulative support body 20, whereby metal film electrode 34 becomes a rigid member with the same contour as predetermined surface contour 16. In practice, a flexible electrode needs to only contact a portion of surface contour 16 at full-scale deflection to achieve capacitance-load changes of several hundred percent and more. This allows aperture 26 to be placed in the center of rigid electrode 14 to allow fluid pressure to be applied to the backside of a flexible electrode for measurements of differential pressure and fluid flow. Aperture 26 also can be used to provide open construction to accommodate a clamped sensing diaphragm with a boss or suspended proof mass.

Figure 4:
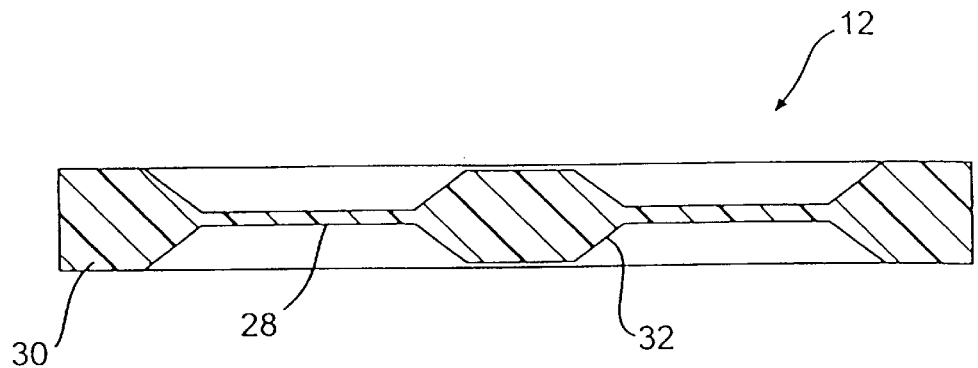
FIG. 4 shows a cross-sectional view of a flexible electrode in accordance with the present invention, comprising a diaphragm with an integral support rim and central hub responsive to acceleration forces.

FIG. 4 shows a cross-sectional view representative of a flexible electrode generally shown by reference numeral 12 comprising diaphragm 28 with support rim 30 and central hub 32 responsive to forces of acceleration for use in an alternate embodiment of variable capacitance apparatus 10 of FIG. 1.

Figure 5A:
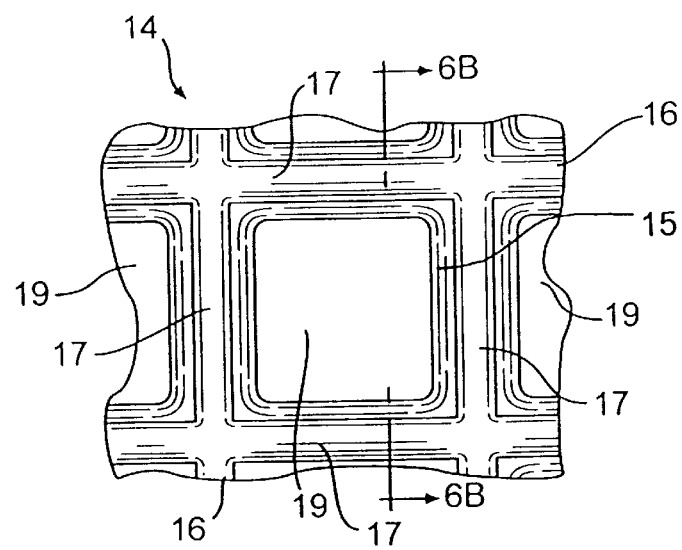
FIGS. 5A and 5B are simplified views of a rigid capacitor electrode with a surface contour comprising an orthogonal arrangement of multiple ridges, in accordance with the present invention.
Figure 5B:
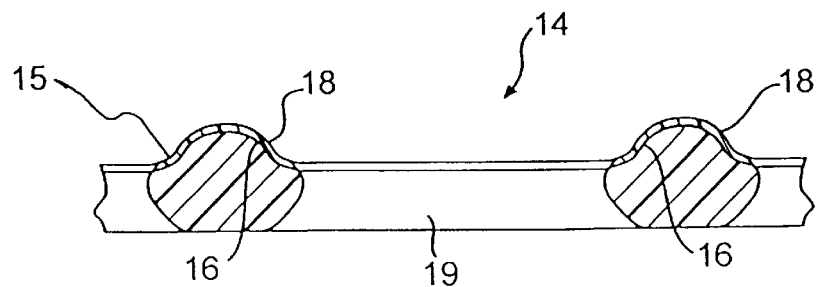

FIG. 5A is a simplified cross-sectional view representative of a rigid electrode generally shown by reference numeral 14 with a surface contour 16 comprising an orthogonal array of ridge segments 17 and apertures 19 for an alternate embodiment of variable capacitance apparatus 10 of FIG. 1. The ridge segments 17 form multiple rigid-electrode elements connected in parallel by the electrical conductivity of the material used to fabricate rigid electrode 14. If rigid electrode 14 is constructed from silicon a thin dielectric spacer 18 can be grown on surface contour 16 by thermal oxidation, as shown in FIG. 5B. The use of multiple ridge segments 17 reduces the spacing between the ridges to increase the natural resonant frequency of a variable capacitor with a thin, clamped diaphragm. This increases the frequency response of variable capacitor apparatus 10 of FIG. 1 without a substantial reduction in quiescent capacitance or capacitance-load sensitivity due to a smaller size sensing diaphragm. The specific shape of rigid electrode 14 shown in FIGS. 5A and 5B is one fabricated from doped, single-crystal silicon by the micromachining methods shown in FIGS. 17A–G.

Figure 6:
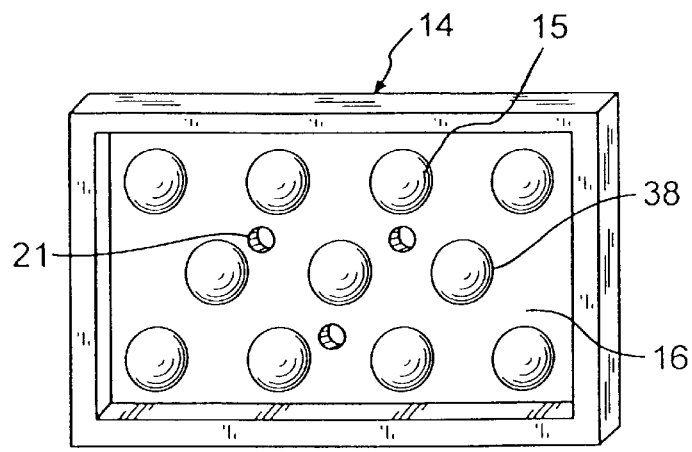
FIG. 6 is a simplified perspective view of a rigid capacitor electrode with a surface contour comprising an array of hillocks, in accordance with the present invention.

FIG. 6 is a simplified cross-sectional view representative of a rigid electrode generally shown by reference numeral 14 with surface contour 16 comprising an array of hillocks 38 for use in an alternate embodiment of variable capacitance apparatus 10 of FIG. 1. Surface contour 16 of FIGS. 5A and 5B and FIG. 6 allows small, micromachined capacitive transducers with thin diaphragms, such as microphones, to have higher quiescent capacitance, higher sensitivity, and higher frequency response than transducers with parallel-plate construction. The surface relief of contour 16 increases the fluid volume between a clamped, conducting diaphragm and rigid electrode 14 to reduce viscous damping. One or more holes 21 in electrode 14 can be included for pressure equalization or venting. Arrays of small ridges and hillocks can be fabricated from single-crystalline silicon substrates using silicon micromachining methods comprising lithographic patterning of etch masks followed by an alternating series of etching steps. Alternately, ridge and hillock structures can be fabricated on insulative substrates by methods used by the optical industry to fabricate lenticular lenses, gratings, and micro-lenses. These methods comprise precision compression molding, precision injection molding, casting, replication, electroforming, embossing, photopolymer replication, ion milling, ion etching, plasma etching, thermal reflow, and molded reflow. The shapes can be formed during the fabrication of the substrate, or by forming the shapes in a material layer added to the substrate, or by transferring shapes formed in an added material layer into the surface of the substrate. An array of microelements fabricated from an insulating material require a metal deposited coating to form a counter-electrode and to connect multiple electrode elements in parallel.

Figure 7:
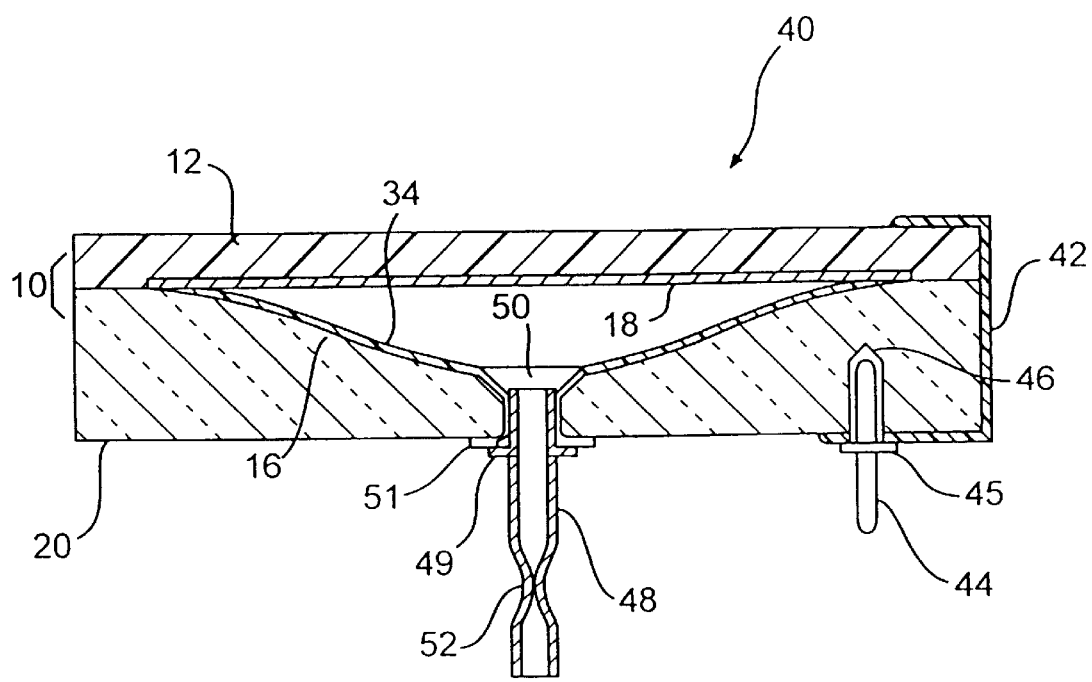
FIG. 7 shows a simplified cross-sectional view, not to scale, of a capacitor transducer in accordance with the present invention.

FIG. 7 is a simplified cross-sectional view, not to scale, of a capacitive transducer generally shown by reference numeral 40 that includes variable capacitor apparatus 10 of the present invention. Variable capacitor apparatus 10 comprises: flexible electrode 12 responsive to a physical effect, metal film electrode 34 deposited on surface contour 16 of glass support body 20, and dielectric spacer 18. Flexible electrode 12 is fabricated from doped, single-crystal silicon and dielectric spacer 18 is a thin layer of silicon dioxide thermally grow on the bottom surface of electrode 12. Dielectric spacer 18 maintains a substantially constant effective capacitance spacing with deflection of flexible electrode 12. Metal film electrode 34 is fabricated by vacuum sputter depositing a layer of gold over a thin layer of chrome on surface contour 16 that is precision ground in the top surface of support body 20. Predetermined surface contour 16 is dimensioned to provide a specific change in the effective area of variable capacitor apparatus 10 as flexible electrode 12 deflects in response to a force or pressure load. The perimeter of flexible electrode 12 is anodically bonded to support body 20 of borosilicate or aluminosilicate glass to create a strong, dimensionally stable assembly to hold flexible electrode 12 and metal film electrode 34 in a fixed electrically insulative relationship.

A gold/chrome coating 42 is vacuum sputter deposited on the top surface and sidewall of flexible electrode 12 and on the sidewall and a portion of the bottom surface of glass support body 20. This provides an electrical path between flexible electrode 12 of conducting silicon and contact pin 44 with shoulder 45 that is inserted and soldered in blind hole 46. A gold-plated, copper tube 48 with shoulder 49 is inserted in center hole 50 and soldered at shoulder 49 to a gold/chrome pad 51 sputter deposited around hole 50 to provide an electrical connection to metal film electrode 34. The copper tube 48 can be used to evacuate capacitive transducer 40 before pinch-off at location 52. The capacitive-load sensitivity and dynamic range of transducer 40 with typical dielectric film thickness of 20 to 200 nm are very high compared to the sensitivity and dynamic range of transducers with substantially parallel-plate capacitors. The material of dielectric spacer 18 can be silicon dioxide, silicon nitride, or another insulating material that can be reliably grown or deposited on flexible electrode 12. Alternatively, dielectric spacer 18 can be deposited on metal film electrode 34.

Figure 8B:
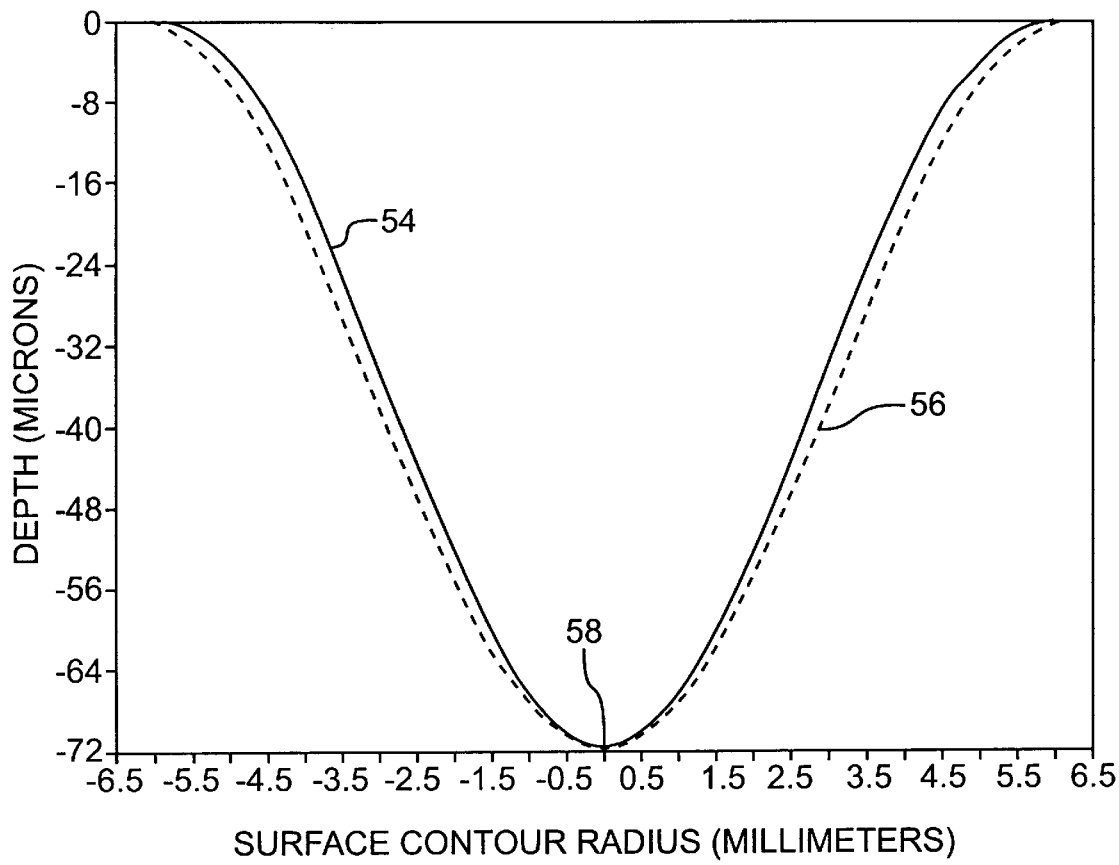
FIG. 8B is a plot of two surface contours shown in the table of FIG. 9A.

FIG. 8A is a Table 1 of the coordinates for two different surface contours $y_1(r)$ and $y_2(r)$ selected for transducer 40 of FIG. 7. The corresponding plots 54 and 56 of surface contour depths $y_1$ and $y_2$ as a function of contact radius respectively are shown in FIG. 8B. Both surface contours 54 and 56 have a radius of substantially 6.2-mm and the depth of contours 54 and 56 at their centers 58 is substantially 71.7 microns. Contour 54 was computed to maximize the linear dynamic range of transducer 40. This causes the area of variable capacitor 10 to increase linearly with increasing capacitance due to deflection of flexible electrode 12. The desired linear response is obtained for flexible electrode 12 of transducer 40 of FIG. 7 over a wide range of thickness where tensile stresses due to stretching are small compared to bending stresses. Surface contour 56 was computed to compensate for a non-linear transfer function of a particular capacitance detection circuit. Contour 56 maximizes the linear dynamic range of capacitive transducer 40 and non-linear detection electronics acting together as a sensor system. Specifically, surface contour 54 was computed for capacitive transducer 40 at the location of $C_2$ in FIG. 15 where the output of circuit 200 is linear with changes in $C_2$. Surface contour 56 was computed for capacitor transducer 40 at the location of $C_1$ in FIG. 15 where the output of circuit 200 is non-linear with changes in $C_1$ due to the increase in the average voltage at common node 220 with increasing values of capacitor $C_1$.

Figure 9:
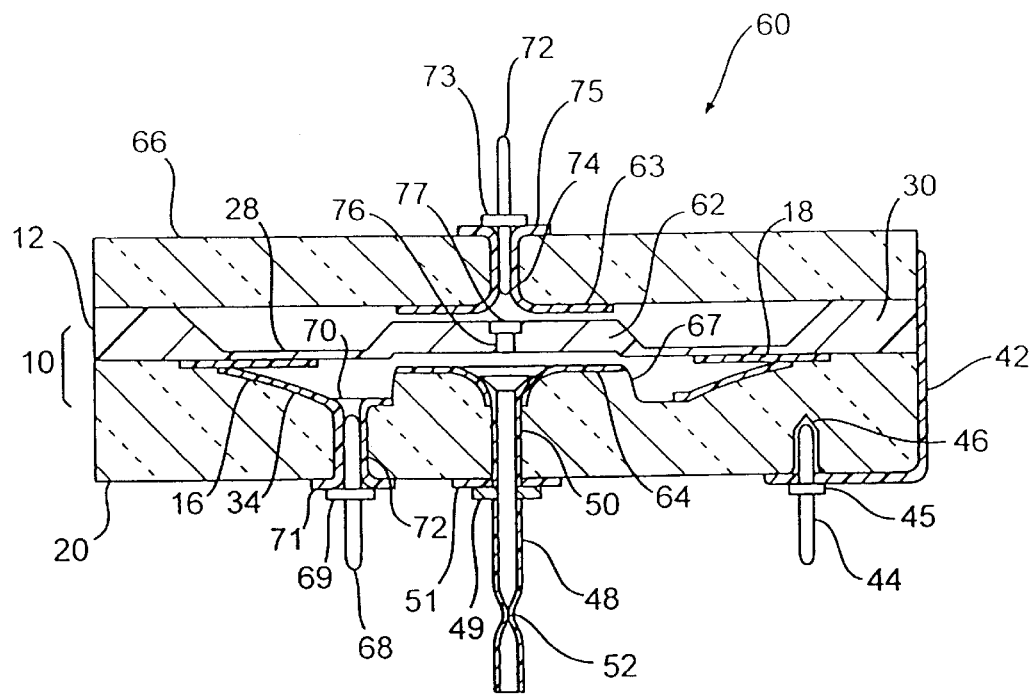
FIG. 9 is a simplified cross-sectional view, not to scale, of a capacitive transducer for sensing acceleration using electrostatic force-balance feedback, in accordance with the present invention.

FIG. 9 is a simplified, cross-sectional view, not to scale, of an improved, force-balanced accelerometer generally shown by reference numeral 60 that includes one preferred embodiment of the variable capacitor apparatus 10 of the present invention. Variable capacitor apparatus 10 comprises: flexible electrode 12, metal film electrode 34 deposited on surface contour 16 of support body 20, and dielectric spacer 18. Acceleration force is sensed by proof mass 62 suspended by electrically conducting diaphragm 28 of flexible electrode 12. Flexible electrode 12 of doped, single-crystal silicon material has a diaphragm 28, integral support rim 30, and suspended proof mass 62 that are etched from a silicon substrate with the thickness of support rim 30. A metal film electrode 34 of gold/chrome is vacuum sputter deposited to surface contour 16 that is precision ground in the top surface of glass support body 20. Thin dielectric spacer 18 of silicon dioxide is thermally grown on the bottom surface of flexible electrode 12. Dielectric spacer 18 maintains a substantially constant effective capacitance spacing between metal film electrode 34 and flexible electrode 12 with deflection of diaphragm 28. Surface contour 16 is dimensioned to obtain high values of quiescent capacity and capacitive-displacement sensitivity for variable capacitor apparatus 10 compared to substantially parallel-plate capacitors. The top and bottom surfaces of silicon proof mass 62 are etched back to provide dielectric gaps between the top and bottom surfaces of proof mass 62 and metal-film, capacitor plates 63 and 64 respectively, thereby forming two, parallel-plate capacitors with commonly connected electrodes of silicon. Support rim 30 of flexible electrode 12 is anodically bonded to support body 20 of borosilicate or aluminosilicate glass to create a strong, dimensionally stable assembly to hold flexible electrode 12 and metal film electrode 34 in a fixed electrically insulative relationship. A top glass substrate 66 of borosilicate or aluminosilicate glass is also anodically bonded to the top surface of support rim 30 of silicon. Capacitor plate 63 of gold/chrome is vacuum sputter deposited to the bottom surface of glass substrate 66 with an areal extent and alignment that substantially matches the top surface of proof mass 62. Capacitor plate 64 of gold/chrome is vacuum deposited to a flat land 67 in the center of the top surface of support body 20. A gold/chrome conductor 42 is vacuum sputter deposited on a portion of the sidewalls of glass substrate 66 and support rim 30 and on a portion of the sidewall and bottom surface of glass support body 20 to provide an electrical path from flexible electrode 12 to contact pin 44. Contact pin 44 with shoulder 45 is inserted and soldered in blind hole 46. A second contact pin 68 with shoulder 69 is inserted in hole 70 in support body 20 and soldered to gold/chrome pad 71 sputter deposited around hole 70 to provide an electrical connection to metal film electrode 34. A third contact pin 72 with shoulder 73 is inserted in hole 74 in top glass substrate 66 and soldered to gold/chrome pad 75 to make contact to metal-film electrode 63. A gold-plated copper tube 48 with shoulder 49 is inserted in center hole 50 of support body 20 and soldered to gold/chrome pad 51 to provide electrical contact to capacitor plate 64. Copper tube 48 also can be used to evacuate, or partially evacuate, the interior volume of accelerometer 60. Through hole 76 and narrow channel 77 in proof mass 62 provide a path to allow the volume above flexible electrode 12 to be evacuated. After evacuation, copper tube 48 is pinched-off at location 52 to maintain the desired pressure in the interior volume of accelerometer 60.

Force acting on proof mass 62 causes diaphragm 28 to deflect. This deflection is sensed by detecting the change in capacitance between diaphragm 28 and rigid metal film electrode 34 with an intermediate dielectric spacer 18. Electronics external to accelerometer 60 transduce capacitance changes to an amplified electrical output that is used to provide closed-loop control voltages to capacitor plates 63 and 64. A voltage applied to capacitor plate 63 creates an upward electrostatic force on proof mass 62 and a voltage applied to capacitor plate 64 creates an downward electrostatic force on proof mass 62. Whereby, closed-loop control voltages can be used to provide electrostatic force-feedback to null acceleration, vibrational, and gravitational forces acting on proof mass 62 to maintain the mass in a substantially stationary position. In one force-balance feedback arrangement, a DC voltage is applied to electrode 63 to balance the force of gravity acting on proof mass 62 and an AC control voltage, superimposed on a smaller DC bias voltage, is applied to electrode 64 to maintain proof mass 62 in a substantially fixed position.

Figure 10:
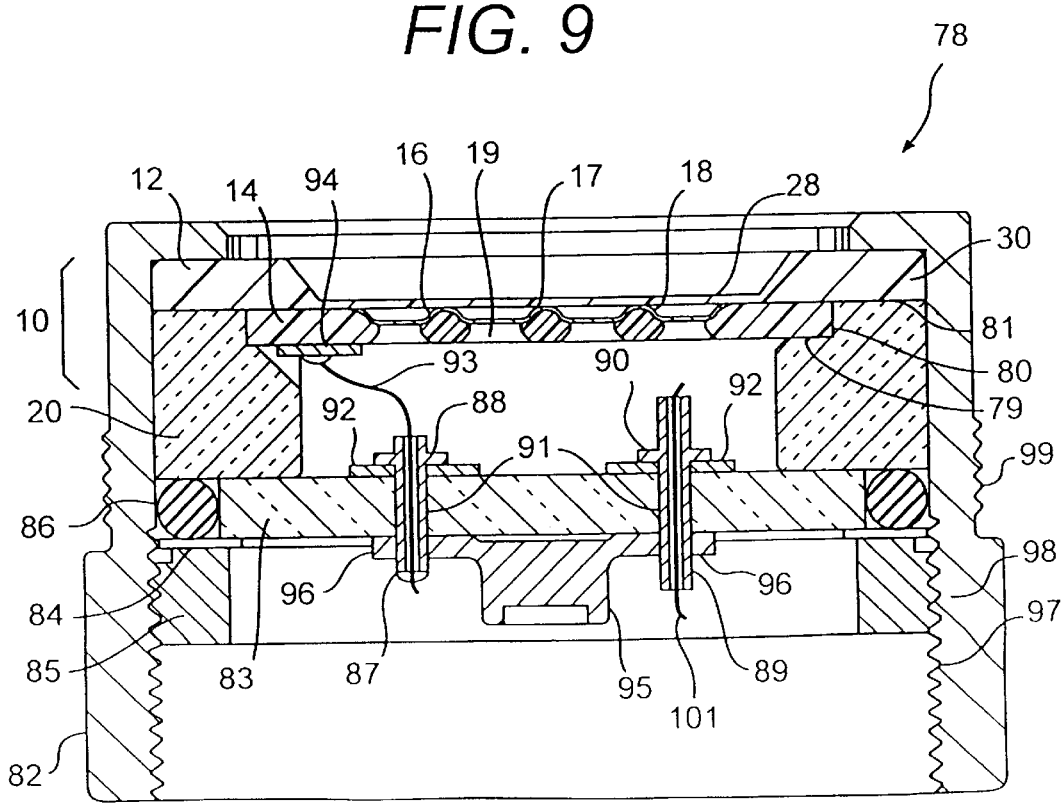
FIG. 10 is a simplified cross-sectional view, not to scale, of a capacitive microphone, in accordance with the present invention.

FIG. 10 is simplified cross-sectional view, not to scale, of a capacitive microphone cartridge generally indicated by reference numeral 78 that includes variable capacitor apparatus 10 of the present invention. Variable capacitor apparatus 10 comprises: flexible electrode 12 of doped, single-crystal silicon; rigid electrode 14 of doped, single-crystal silicon; dielectric spacer 18 of silicon dioxide; and support body 20 of borosilicate or aluminosilicate glass. Rigid electrode 14 is generally of the design shown in FIGS. 5A and 5B. Surface contour 16 comprises an orthogonal arrangement of multiple ridges 17 forming a square array of 16 square apertures 19. Dielectric spacer 18 is thermally grown over multiple ridge segments 17 on surface contour 16. Microphone cartridge 78 is representative of a standard half-inch diameter, microphone cartridge that mates to a preamplifier housed in a half-inch diameter tube with a central, spring-loaded pin electrode. The quiescent capacitance of variable capacitor apparatus 10 of microphone cartridge 78 is increased by the additional capacitive area provided by using multiple ridge elements 17. The quiescent capacitance of variable capacitor apparatus 10 ranges between 100 and 200 picofarads for a substantially 160-nm thick, dielectric spacer 18 of silicon dioxide and a rigid electrode 14 fabricated by the micromachining methods shown in FIGS. 17A–G. These values are substantially five to ten times higher than those of half-inch, research-grade microphones with metal foil diaphragms and counter-electrodes in substantially parallel plate arrangements. As a result, microphone cartridge 78 with a one-micron thick silicon diaphragm 28 and a rigid electrode 14 with multiple ridges 17 has higher acoustic sensitivity and a wider frequency response than prior art microphone cartridges of equivalent size. Rigid electrode 14 is anodically bonded to surface 79 of counter-bore 80 of a support body 20. Flexible electrode 12, comprising silicon diaphragm 28 and integral support rim 30, is anodically bonded to top surface 81 of support body 20. The depth of counter-bore 80 and the height of ridge segments 17 are dimensioned to cause mechanical interference whereby the apex of ridges segments 17 preload diaphragm 28 to provide reliable physical contact between ridge segments 17 across the diameter of diaphragm 28. Variable capacitor apparatus 10 is held in housing 82 by glass plate 83, bearing washer 84, and threaded retaining ring 85. A hermetic seal is provided by O-ring 86 of polymeric material. A first gold-plated, hollow copper tube 87 with shoulder 88 and a second hollow tube 89 with shoulder 90 are inserted in two, through holes 91 in glass plate 83 and soldered in place at shoulders 88 and 90 to two, gold/chrome pads 92 vacuum sputter deposited on the top surface of glass plate 83. A wire lead 93 is soldered to a third gold/chrome pad 94 vacuum sputter deposited to the bottom surface of rigid electrode 14. The other end of wire lead 93 is threaded through and soldered to the bottom end of hollow copper tube 87. A gold-plated, brass contact plate 95 is adhered to the bottom of glass plate 83 with two holes 96 allowing hollow tubes 87 and 89 to pass through to register the position of contact plate 95 to glass plate 83. A gold-plated wire 101 of a selected diameter can be threaded through hollow tube 89 to provide a metered pressure equalization vent with a desired equalization time constant. Alternatively hollow tube 89 can be replaced by a porous, sintered-metal plug to establish the time constant of pressure equalization. Internal machine threads 97 on housing 82 mate with external threads 98 on retaining ring 85 and with external threads of a preamplifier assembly. Exterior threads on housing 99 are used to mount a protective screen to the front of microphone cartridge 78.

Figure 11:
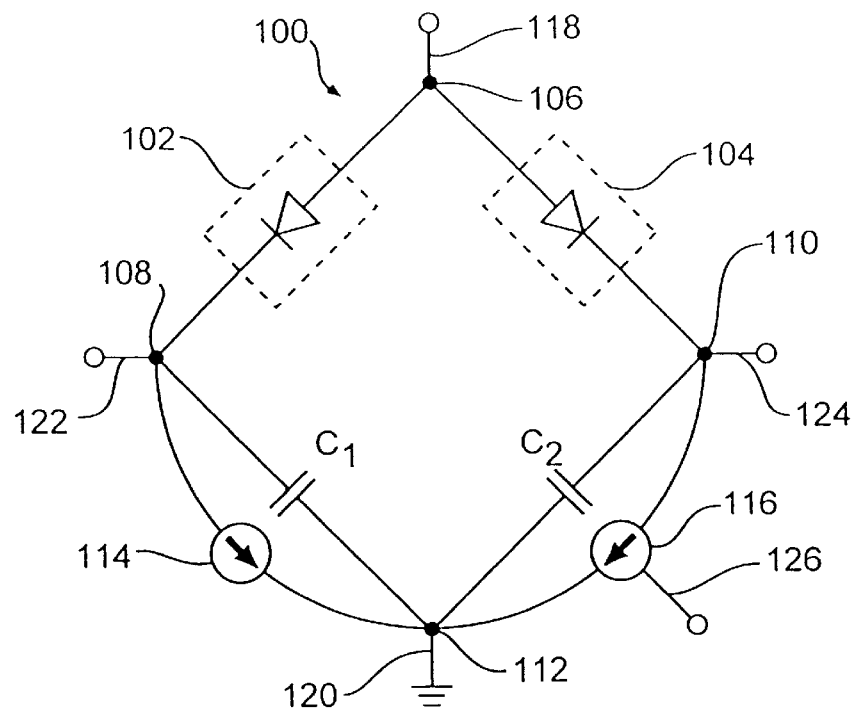
FIG. 11 is a simplified circuit diagram that illustrates a first embodiment of capacitance detection in accordance with the present invention.

The general concept of the capacitive detection circuit of one aspect of the present invention is shown in FIG. 11. The capacitance detection circuit that has a bridge-like circuit arrangement is shown generally by reference numeral 100. Isolation means 102 and 104 are connected to a first common node 106 and to a second common node 108 and to a third common node 110 respectively. Capacitors $C_1$ and $C_2$ are connected to ground node 112 and to common node 108 and common node 110 respectively. A constant current source 114 is connected between common node 108 and ground node 112. A voltage-controlled current source 116 is connected between common node 110 and ground node 112. A bridge excitation voltage terminal 118 is connected to common node 106 and a signal ground conductor 120 is connected to ground node 112. Signal terminals 122 and 124 are connected to common nodes 108 and 110 respectively. Current source 116 is connected to voltage control terminal 126.

Figure 12A:
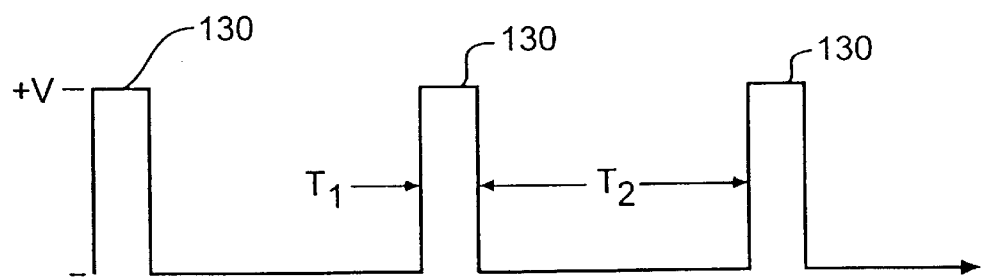
FIGS. 12A–E are timing diagrams for the electrical signals of the circuit of FIG. 11.
Figure 12B:
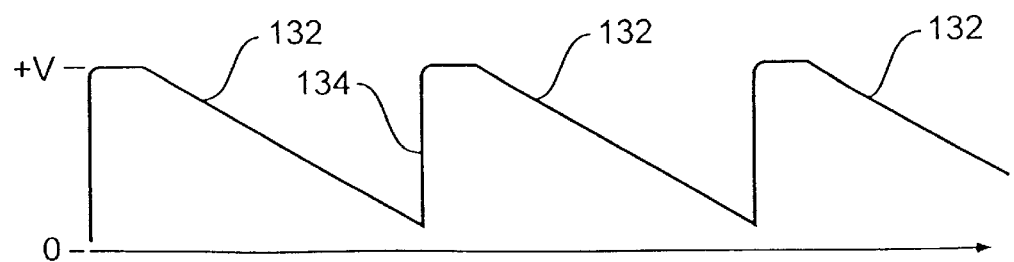
Figure 12C:
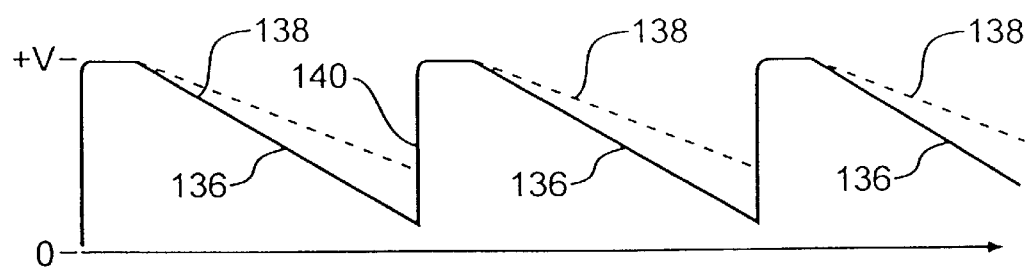
Figure 12D:
Figure 12E:
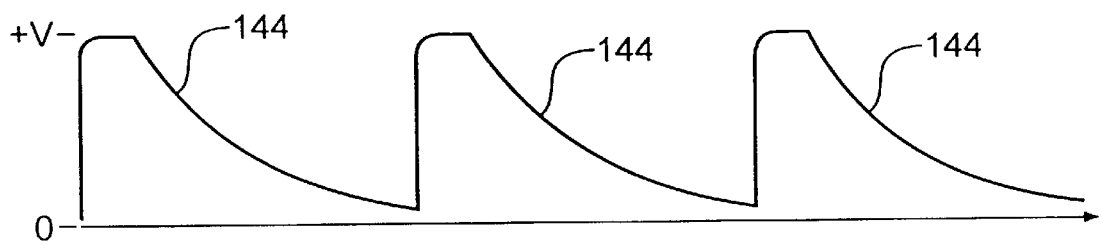

The operation of the bridge-like, capacitance detection circuit 100 in FIG. 11 will now be described with reference to the timing diagrams of FIGS. 12A–E. FIG. 12A shows a repetitive train of pulses 130 of constant amplitude +V that are applied to excitation voltage terminal 118. During time $T_1$, isolation means 102 and 104 electrically conduct allowing capacitors $C_1$ and $C_2$ to rapidly charge to voltage +V, less any residual voltage drop across isolation means 102 and 104. At the end of time $T_1$, pulse 130 ends causing isolation means 102 and 104 to stop conducting. During time $T_2$, the voltages across capacitors $C_1$ and $C_2$ decrease in proportion to the magnitudes of the currents sunk by current source 114 and by voltage-controlled, current source 116 respectively. FIG. 12B shows the resulting voltage waveform 132 across capacitor $C_1$ at common node 108, and FIG. 12C shows the corresponding voltage waveform 136 across $C_2$ at common node 110 for the case when capacitors $C_1$ and $C_2$ are of equal value and current sources 114 and 116 sink identical current. During time $T_1$, pulse 130 rapidly charges capacitors $C_1$ and $C_2$ to +V as indicated by leading edges 134 and 140 and during time $T_2$ the voltage across $C_1$ and $C_2$ decreases at a slower rate to a value approaching ground or to another reference potential applied to node 112. For this balanced condition, the differential voltage across common nodes 108 and 110 will be substantially zero, and the voltage waveform 132 across capacitor $C_1$, in FIG. 12B, will be substantially identical to the voltage waveform 136 across capacitor $C_2$, indicated by the solid line in FIG. 12C. If the value of capacitor $C_2$ increases when current sources 114 and 116 sink identical current, the bridge becomes unbalanced. This causes the time averaged value of the new voltage waveform 138 at common node 110, shown by the dashed line in FIG. 12C, to increase with respect to the time averaged value of the voltage waveform 132. FIG. 12D shows a voltage waveform 142 corresponding to the differential voltage between common node 108 and common node 104, when $C_2$ is greater that $C_1$.

The capacitive detection feature of the present invention is based upon using the differential voltage waveform 142 of FIG. 12D as an error signal in a negative feedback circuit arrangement. The error signal (or time average of the error signal) is amplified at high gain to provide a voltage to control current source 116 to force it to null the voltage (or time averaged voltage) between common nodes 108 and 110. When $C_2$ is greater that $C_1$, negative feedback voltage at control terminal 126 causes current from current source 116 to increase. This control action causes waveform 138 of FIG. 12C to have the form of waveform 136 which at balance is substantially identical to waveform 132 of FIG. 12B. It will be shown that the change in discharge current $\Delta I_c$ from current source 116 is directly proportional to the change in capacitance $\Delta C_2$, and this relationship remains linear for large values of $\Delta C_2/C_2$.

In one preferred embodiment of the capacitive detection circuit of the present invention, current source 114 is replaced by a resistor that discharges the voltage on $C_1$ to a value that approaches zero during time $T_2$. In this case, the capacitor voltage at node 108 comprises a repetitive waveform of exponentially decaying pulses 144 shown in FIG. 12E. The exponential shape of the waveform does not change the linear relationship between the change in current $\Delta I_c$ with changes in capacitance $\Delta C_2$. The use of a resistor has two advantages over an active current source for discharging capacitor $C_1$, which can be a reference capacitor. Active current sources are more complex and generally have higher electrical noise than thin-film resistors with values typically used in the bridge-like circuits of the present invention. Capacitive detection circuits have been constructed with bridge excitation frequencies ranging from 20 kHz to 1 MHz and with corresponding values of discharge resistors in the 3 kΩ to 120 kΩ range. When micropower circuit operation is required from a low-voltage supply, the bridge excitation frequency can be 20 kHz or less.

In the capacitance detection bridge circuit 100 of FIG. 11 capacitors $C_1$ and $C_2$ are discharged from an initial voltage of substantially +V. However, all the advantages of the capacitive detection circuits of the present invention can be realized if the capacitors $C_1$ and $C_2$, in a transposed circuit arrangement, are charged to substantially +V during time $T_2$ and rapidly discharged during a shorter time $T_1$. Such a transposed circuit is shown generally by reference numeral 146 in FIG. 13. Isolation means 102 and 104 are connected to terminals 148 and 150 and to a first, common node 152 and to a second common node 154 respectively. Capacitors $C_1$ and $C_2$ are connected to ground node 112 and to common node 152 and common node 154 respectively. Resistors $R_1$ and $R_2$ are connected to a third common node 156 and to common nodes 152 and 154 respectively. A voltage-controlled, constant current source 116 is connected between common nodes 154 and 156. Signal terminals 122 and 124 are connected to common nodes 152 and 154 respectively and a signal ground conductor 120 is connected to ground node 112. A positive voltage terminal 158 is connected to common node 156 and voltage control terminal 126 is connected to current source 116.

The operation of the bridge-like, capacitive detection circuit 146 in FIG. 13 will now be described with reference to the timing diagrams of FIGS. 14A–D. FIG. 14A shows a repetitive train of pulses 160 of constant amplitude +V that are applied to input terminals 148 and 150. During time $T_1$, isolation means 102 and 104 are electrically non-conducting which allow capacitors $C_1$ and $C_2$ to charge to voltage +V at node 156. During time $T_2$, isolation means 102 and 104 are electrically conducting which rapidly discharge capacitors $C_1$ and $C_2$ to substantially a zero ground potential, or another reference voltage applied to common node 112. FIG. 14B shows the resulting voltage waveform 162 across capacitor $C_1$ at common node 152. FIG. 14C shows the resulting voltage waveform 164 across capacitor $C_2$ at common node 154 for the case when capacitors $C_1$ and $C_2$ are of equal value and when the current from source 116 is zero. If the value of capacitor $C_2$ increases when current source 116 is inactive, the bridge circuit 146 becomes unbalanced and the time averaged value of the new voltage waveform 168 at common node 154, shown by a dashed line in FIG. 14C, decreases with respect to the time averaged value of the voltage waveform 162 at common node 152. FIG. 14D shows a voltage waveform 170 corresponding to the differential voltage $\Delta V$ between mode 154 and node 152, when $C_2$ is greater that $C_1$. The differential waveform 170 is then used as an error signal in a feedback circuit arrangement to control current source 116 to force it to null the voltage between common nodes 152 and 154.

The capacitive sensitivity of capacitive bridge circuit 100 of FIG. 11, in terms of the change in differential output voltage $\Delta V_o$ for a given change in capacitance, $\Delta C/C$, is comparable or higher than the sensitivity of conventional bridge networks. Since the two bridge capacitors $C_1$ and $C_2$ are charged to the peak potential +V of the short excitation pulse 130 of FIG. 12A, a loss of one-half does not occur due to voltage division across fixed components in the two, adjacent arms of the bridge network containing isolation devices 102 and 104. Also, the duty cycle of bridge excitation increases the average value of the differential bridge output over repetitive charge-discharge cycles.

One preferred embodiment of the capacitance detection circuit in accordance with the present invention, generally identified with reference numeral 200, is illustrated in FIG. 15. Circuit 200 is configured to measure the difference in capacitance between capacitors $C_1$ and $C_2$, where $C_2$ is a variable capacitor. Capacitor $C_1$ may be a fixed reference capacitor or a second variable capacitor. Circuit 200 includes pulse generator 202; isolation means 204 and 206; capacitors $C_1$, $C_2$, $C_3$, $C_4$, and may include optional capacitor $C_5$; resistors $R_1$, $R_2$, $R_3$, $R_4$; and may include optional resistor $R_5$; and differential amplifier 208. The pulse generator 202 is connected by line 210 to input node 212 which is connected to isolation means 204 and 206. Isolation means 204, resistor $R_1$, resistor $R_3$ and capacitor $C_1$ are connected to a first common node 214 and one side of resistor $R_1$ and capacitor $C_1$ are connected in parallel to common return line 216. Isolation means 206, resistor $R_2$, resistor $R_4$, optional resistor $R_5$, and capacitor $C_2$ are connected to a second common node 218 and one side of capacitor $C_2$ and optional $R_5$ are connected to common return line 216. One side of resistor $R_3$, capacitor $C_3$, and the non-inverting input of difference amplifier 208 are connected to a third, common node 220. Also, one side of resistor $R_4$, capacitor $C_4$, optional capacitor $C_5$, and an inverting input to amplifier 208 are connected to a fourth common node 226. The other side of capacitors $C_3$ and $C_4$ are connected to common return line 216 which may be returned to ground or to a reference voltage applied to terminal 228. Resistor $R_2$, optional capacitor $C_5$, and the output of amplifier 208 are connected to common output node 230. Resistor $R_3$ and capacitor $C_3$ act together as a first low-pass filter 238 with a time constant, $\tau_1=R_3C_3$ and resistor $R_4$ and capacitor $C_4$ serve as a second low-pass filter 240 with a time constant, $\tau_2=R_4C_4$. Low-pass filters 238 and 240 provide a running average of the repetitive voltage waveforms at common nodes 214 and 218 respectively at the inputs to amplifier 208. The output voltage $V_o$ from the capacitive detection circuit 200 is provided at contact 232. The differential amplifier 208 may be operated from a single, low-voltage power supply by connecting its positive terminal to contact 234 and its ground terminal to 236 and terminal 228. Alternately, the positive and negative terminals of a bipolar supply can be connected to contacts 234 and 236 respectively. Isolation means 204 and 206 can be Schottky diodes 222 and 224 or PN-junction diodes, a base-to-collector connected transistor, CMOS or JFET transistors, or other types of electrical switches. When transistors or electrical switches are used, their on-off isolation function is required to be controlled and synchronized by pulse generator 202.

The operation of capacitive detection circuit 200, in FIG. 15 will be described first in general terms before discussing its linear response and conditions for stability. Pulse generator 202 repetitively charges capacitors $C_1$ and variable capacitor $C_2$ via isolation means 204 and 206 respectively. Resistor $R_3$ and capacitor $C_3$ act together as a low-pass filter with a corner frequency $f_o=1/(2\pi R_3C_3)$. For excitation frequencies significantly higher than $f_0$, the filter provides a running average of the repetitive voltage waveform on $C_1$ (node 214) to the non-inverting input of differential amplifier 208. Likewise, resistor $R_4$ and capacitor $C_4$ provide a running average of the repetitive voltage waveform on $C_2$ (node 218) to the inverting input of amplifier 208. Any finite voltage difference at the inputs to amplifier 208 is amplified by the full, open-loop gain of amplifier 208. This input voltage difference is substantially zero when the bridge-like, capacitive detection circuit 200 is balanced: when $C_1=C_2$ and $R_1=R_2$, or alternately when time constants $\tau_1=C_1R_1$ and $\tau_2=C_2R_2$ are matched. For either of these two conditions, negative feedback at high, open-loop gain forces the output of amplifier 208 to be substantially zero volts when operated from a bipolar power supply or to a potential that matches a reference voltage on common return line 216 when amplifier 208 is operated from a single supply. Amplifier 208 operates as a transconductance amplifier which has the functions of a voltage-controlled current source. For the condition that $C_1=C_2$ and $R_1=R_2$, the output of amplifier 208 is substantially zero volts which causes it to sink the same amount of current from capacitor $C_2$ through load resistor $R_2$ as the current sunk by common return line 216 from capacitor $C_1$ through resistor $R_1$.

The applications and benefits of capacitance detection circuit 200 can be further appreciated by a review of several design features and options. Low-pass filters 238 and 240 serve two functions. First they limit the frequency of the differential input signals at nodes 214 and 218 to the maximum frequency required to be detected from changes in variable capacitor $C_2$. This avoids the requirement to amplify higher frequencies associated with bridge excitation and the resulting periodic waveforms at common nodes 214 and 218. This limits amplification and feedback control to frequencies where amplifier 208 has higher gain and common-mode signal rejection and a greater phase margin for close-loop stability. Low-pass filters 238 and 240 are not always necessary when the frequency response of an operational amplifier used for amplifier 208 is limited internally to values much less than those of the bridge excitation frequency. In many circuit embodiments, it is desirable and often necessary to use optional capacitor $C_5$ to limit the high frequency gain of amplifier 208 to further enhance feedback stability.

Figure 13:
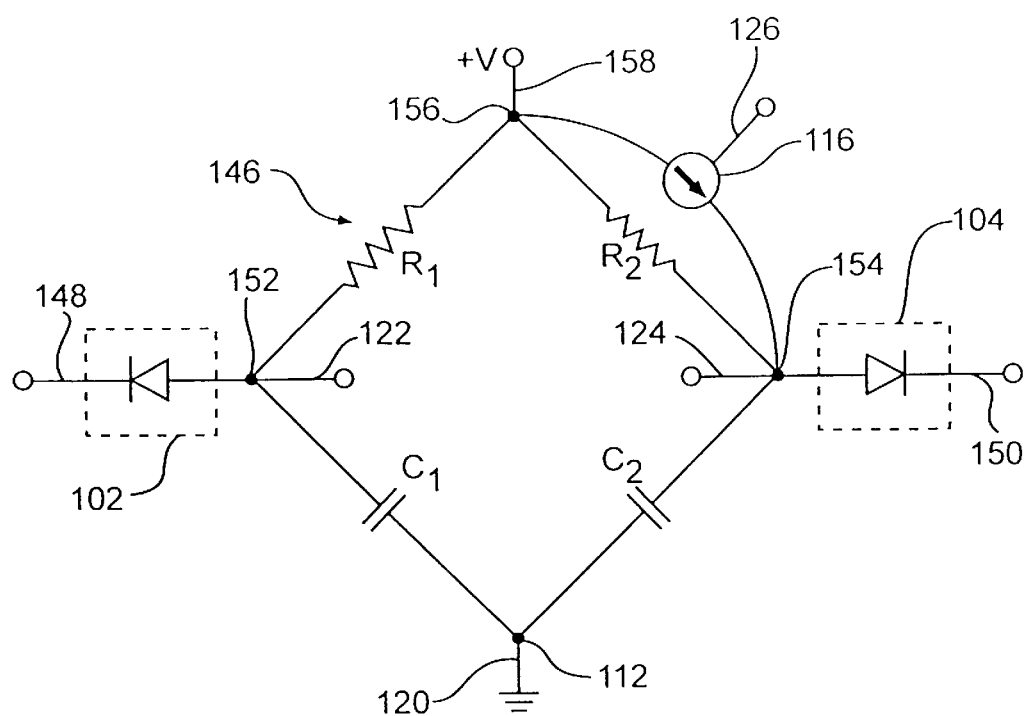
FIG. 13 is a simplified circuit diagram that illustrates a second embodiment of capacitance detection, in accordance with the present invention.
Figure 14A:
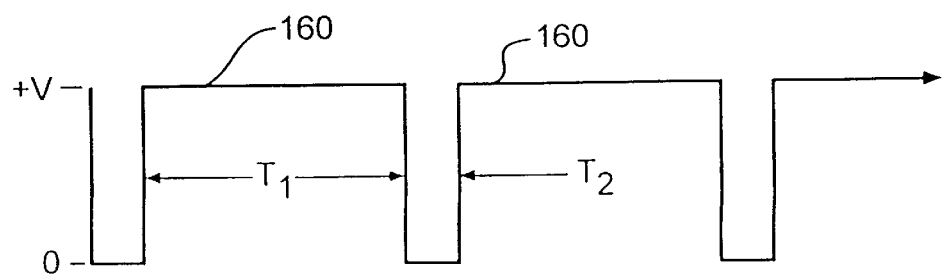
FIGS. 14A–D are timing diagrams for the electrical signals of the circuit of FIG. 13.
Figure 14B:
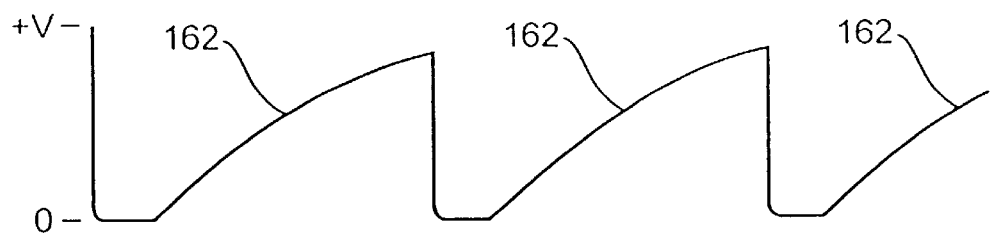
Figure 14C:
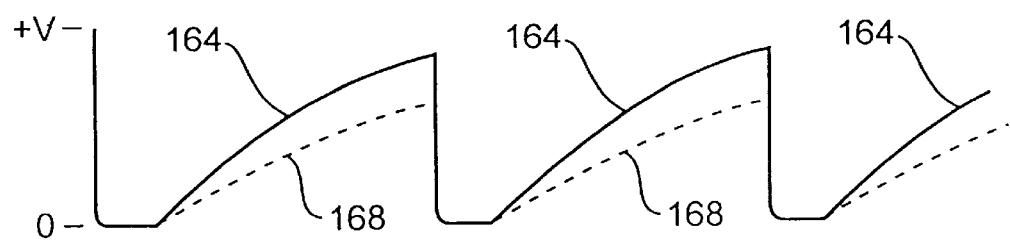
Figure 14D:

One major advantage of capacitive detection circuit 200 that uses the bridge-like circuits of the type shown in FIG. 11 and FIG. 13 is their output voltages are linear with changes of capacitance of a variable capacitor or a variable capacitive transducer located at the position of $C_2$ in circuit 200. It will be shown here that the output voltage of differential amplifier 208, in FIG. 15, is linear with changes in capacitance $\Delta C_2$ of variable capacitor $C_2$. Consider the operation of detection circuit 200 at low-frequencies where the impedances of $C_3$ and $C_4$ are high compared to $R_3$ and $R_4$. Let the output of pulse generator 202 have a repetitive voltage pulse 130 of FIG. 12A and also consider the operation of the circuit during time $T_2$ after pulse 130 has charged capacitors $C_1$ and $C_2$ to substantially +V. Feedback around differential amplifier 208 via node 218 forces the voltage $v^-$ at the inverting input of amplifier 208 to equal the voltage $v^+$ at the non-inverting input. This is the general condition for a voltage amplifier with a virtual ground at the inverting input. Imposing an additional equality condition at the inputs to differential amplifier 208 forces it to become a transconductance amplifier that has all the functions of a voltage-controlled current source. Feedback via node 218 with the full, open-loop gain of amplifier 208 forces the time derivatives $dv^+/dt$ and $dv^-/dt$ at the input to amplifier 208 to become substantially equal under conditions of stable feedback. This condition is maintained by capacitive detection circuit 200 of FIG. 15 at low-frequencies compared to the bridge excitation frequency. The derivative equality requires the discharge current $i_1$ from capacitor $C_1$ to equal the discharge current $i_2$ from capacitor $C_2$, since $i=Cdv/dt$. If capacitor $C_1$ is equal to the quiescent value of variable capacitor $C_2$ and $\Delta C$ is an incremental change of $C_2$, the discharge currents from capacitors $C_1$ and $C_2$ can be expressed in terms of i and $i+\Delta i$ respectively. Since $$\frac{dv^+}{dt} = \frac{dv^-}{dt}$$

and $$\frac{i}{C} = \frac{i + \Delta i}{C + \Delta C}$$

$$\Delta i = i \frac{\Delta C}{C},$$

the change in control voltage $\Delta V_o$ at the output of amplifier 208 for a feedback resistor $R_f$ and a change in capacitance $\Delta C$ is $$\Delta V_o = iR_f \frac{\Delta C}{C}.$$

This linear relationship exists for very large changes in variable capacitance $C_2$. The above analysis considered the performance of circuit 200 during time $T_2$. During the shorter period of time $T_1$, the voltages on capacitors $C_1$ and $C_2$ are substantially identical which decreases the magnitude of the running averages of the differential signals at the inputs to amplifier 208 generally in proportion to the duty cycle of the bridge excitation voltage.

The capacitive detection circuit 200 can be transposed to have a bridge-like network 146 of FIG. 13. This can be accomplished by reversing isolation means 204 and 206 and by returning resistor $R_1$ to +V volts. The bridge-like networks 100 and 146 of FIG. 11 and FIG. 13 can be configured to operate with pulses of negative amplitude when isolation means 102 and 104 are reversed. This requires resistors $R_1$ and $R_2$ in network 146 to be returned to a negative voltage −V. In all circuit arrangements, $C_1$ and $C_2$ can be returned to any low-impedance, AC ground such as a positive or negative supply voltage.

Active shielding can be used with capacitive detection circuit 200 of FIG. 15 to isolate its inputs from stray electrical fields and to minimize signal loss due to voltage drops across parasitic capacitances. FIG. 16 illustrates a method of active shielding when capacitor $C_1$ of circuit 200 is a fixed reference capacitor. A triaxial cable 250 generally connects a variable capacitor transducer 252 to circuit 200. The center conductor 254 of cable 250 connects the signal terminal 256 of transducer 252 to common node 218 of circuit 200. The center conductor 254 is shielded by active, coaxial shield 258 which is connected to the output of unity-gain, buffer amplifier 260. The input to buffer amplifier 260 is connected to common node 214 of circuit 200. Active shield 258 is shielded by ground return shield 262 which connects ground terminal 264 of transducer 252 to common return line 216 of circuit 200. This method of active shielding is very effective because the periodic signal voltage on center conductor 254 is substantially identical to the periodic voltage on active shield 258 because feedback maintains substantially equal voltages on common nodes 214 and 218 of circuit 200. For short lengths of cable 250, buffer amplifier 260 can be deleted and active shield 258 connected directly to common node 214 of circuit 200. The capacitance between active shield 258 and ground return shield 262 is incorporated in parallel with reference capacitor $C_2$.

Rigid electrode 14 of FIGS. 5A and 5B and FIG. 6 with surface contour 16 of ridge segments 17 and hillocks 38 can be manufactured by a number of high-volume, batch processing methods. These manufacturing methods include silicon micromachining process steps used by the semiconductor industry or precision molding, replication, ion milling, plasma etching, and thermal reflow techniques used by the optical industry. When the bulk material of rigid electrode 14 is an insulative material surface contour 16 is required to be coated with a conducting film.

Figure 17A:
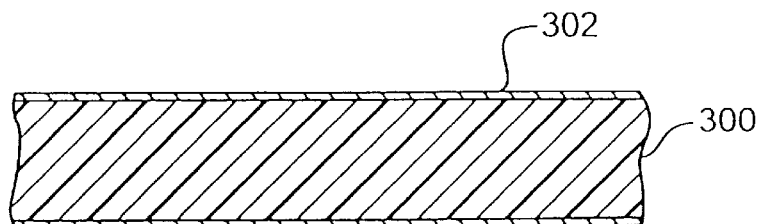
FIGS. 17A–G illustrates the micromachining process steps to fabricate rigid electrodes from single-crystal silicon, as used in accordance with the present invention.
Figure 17B:
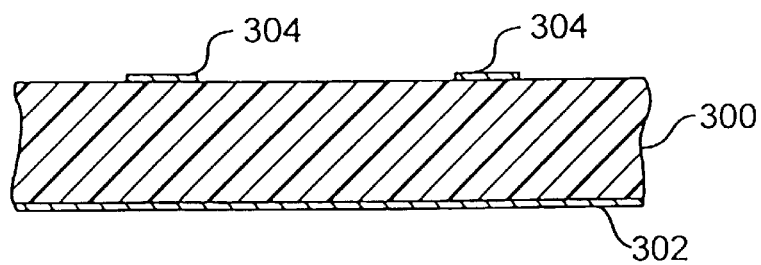
Figure 17C:
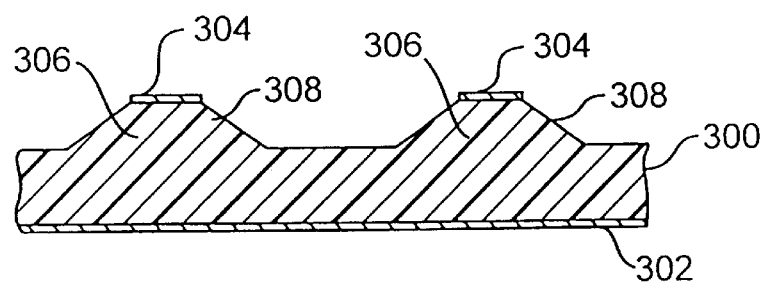
Figure 17D:
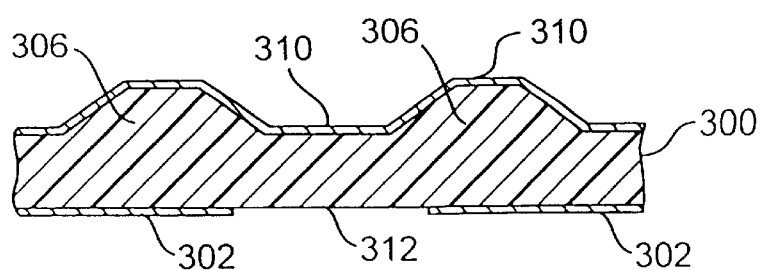
Figure 17E:
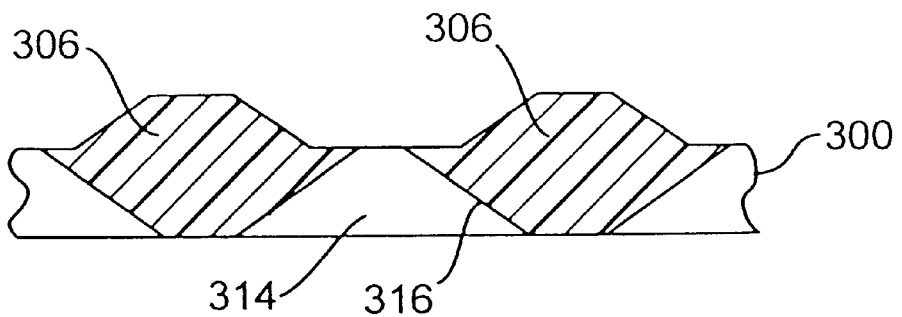
Figure 17F:
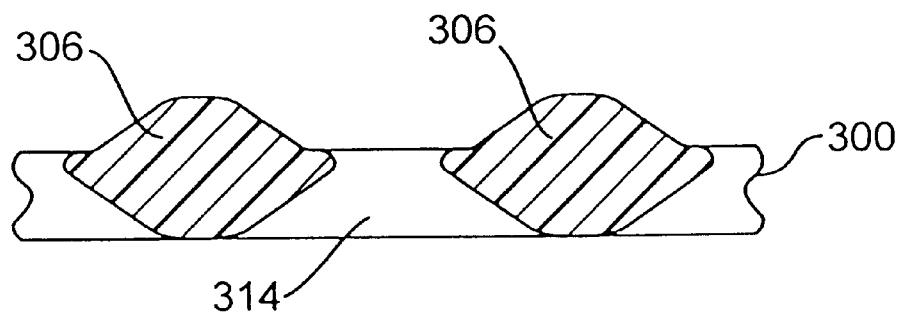
Figure 17G:
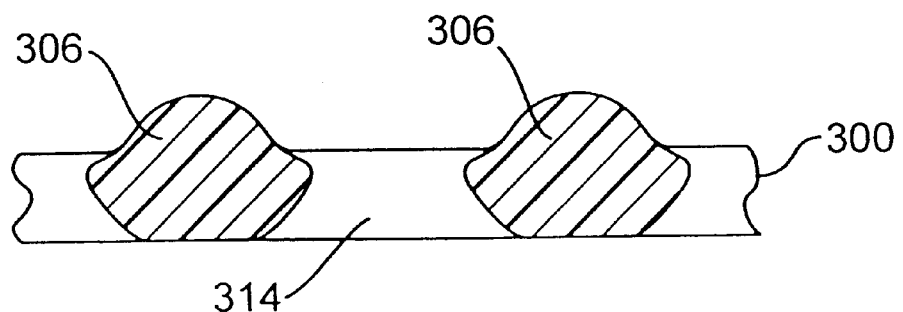

One fabrication method includes micromachining a batch of rigid electrodes 16 with orthogonal ridge segments 17 and rectilinear apertures 19 of the type shown in FIG. 5A from silicon wafers of <100> crystal orientation. Referring to FIG. 17A, silicon wafer 300 with a thermally grown oxide layer 302 on the top and bottom surfaces is lithographically patterned and etched with a hydrofluoric acid solution to form oxide stripes 304 on the top surface that serve as an etch mask as shown in FIG. 17B. Silicon wafer 300 is then anisotropically etched typically using a potassium hydroxide solution to form ridge segments 306 with smooth, 54.7° edge walls 308 that follow the <111> crystal plane of silicon as shown in FIG. 17C. The oxide stripes 304 are then stripped with a hydrofluoric acid solution and a new oxide layer 310 is thermally grown on wafer 300 as shown in FIG. 17D. The oxide layer 302 on the bottom of wafer 300 is then lithographically patterned and etched to form to an array of rectilinear apertures 312 in oxide layer 302 that serves as an etch mask. The wafer 300 is again anisotropically etched using a hydroxide solution to form rectilinear apertures 314 with smooth, 54.7° edge walls 316 as shown in FIG. 17E. The oxide layers 310 and 302 are stripped and wafer 300 is then isotropically etched typically by a nitric and hydrofluoric acid mixture to round the edges and corners of the ridge segments 306 and apertures 314 as shown in FIG. 17F. Next wafer 300 is etched using a hydroxide solution to further round the edges and corners of the ridge segments 306 and apertures 314 as shown in FIG. 17G. This second etch with a hydroxide solution performs a isotropic etch, rather than a anisotropic etch, because no mask or surface geometry on wafer 300 is available to promote preferential etching along a silicon crystal plane. Controlling the time wafer 300 is etched in the two different solutions allows the radius of curvature of the ridge segments to be controlled for a specified width of the oxide stripes 304 of FIG. 17B. The hillocks 38 on rigid electrode 14 of FIG. 6 can also be micromachined from single-crystal silicon using a similar set of masking, isotropic etching, and anisotropic etching steps as those disclosed to fabricate ridge segments 306 in FIG. 17G.

Other volume manufacturing methods that can be used to fabricate surface contour 16 of FIGS. 1, 3, 5A and 5B, 6, 7, 9, and 10 include:

a. precision compression or injection molding of glass and plastics;

b. replication by electroforming, casting, embossing, and photopolymers;

c. ion milling and reactive plasma etching using resists that are gradient exposed by scanning laser or electron beams, the desired surface contour 16 fabricated in resist or the resist profile used to transfer a selected surface contour into the underlying substrate;

d. thermal reflow and molded reflow of glass, crystalline, and plastic shapes formed, deposited, or adhered on the surface of a thermally stable, rigid substrate.

While the preferred forms and embodiments of the instant invention have been illustrated and described, it will be apparent to persons skilled in the art that various changes and modifications can be made to the preferred embodiments disclosed herein without deviating from the invention concepts and true scope of the present invention, and it is intended by the appended claims to cover all such modifications which come within the full scope and true spirit of the invention. The preferred embodiments described above are not meant to limit the scope of the appended claims.

What is claimed is:

1. A variable area capacitor comprising:
   a. a flexible electrode responsive to a physical effect;
   b. a rigid electrode with a three-dimensional surface contour facing said flexible electrode;
   c. a dielectric spacer sandwiched between said flexible electrode and said rigid electrode;
   d. said dielectric spacer maintains a substantially fixed capacitance spacing between regions of mutually opposed areas of said rigid electrode and said flexible electrode, said regions of said fixed capacitance spacing increasing as said flexible electrode deflects in response to said physical effect;
   e. said surface contour having a shape that provides a substantially linear change in capacitance of said variable area capacitor in response to said physical effect.

2. The variable area capacitor of claim 1 wherein the shape of said surface contour provides a substantially linear change in capacitance in response to said physical effect when a generatrix of said flexible electrode is determined primarily by bending stresses.

3. The variable area capacitor of claim 1 wherein the shape of said surface contour provides a substantially linear change in capacitance in response to said physical effect when a generatrix of said flexible electrode is determined primarily by tensile stresses.

4. The variable area capacitor of claim 1, further comprising an insulative support body with said surface contour on which is deposited a conducting film electrode.

5. The variable area capacitor of claim 1 further comprising said flexible electrode with a central aperture.

6. The variable area capacitor of claim 1 wherein said flexible electrode is a diaphragm with an integral support rim.

7. The variable area capacitor of claim 1, wherein said flexible electrode is a diaphragm with a central proof mass.

8. The variable area capacitor of claim 1 wherein said flexible electrode comprises a conducting film adhered to a flexible electrically insulative material selected from a group consisting of glass, fused silica, quartz, sapphire, intrinsic silicon, PMMA, epoxy, moldable plastics, thermoplastics, and thermoset plastics.

9. The variable area capacitor of claim 1 wherein said rigid electrode comprises a conductive film deposited on said surface contour of a material selected from a group consisting of glass, fused silica, quartz, sapphire, intrinsic silicon, PMMA, epoxy, moldable plastics, thermoplastics, and thermoset plastics.

10. The variable area capacitor of claim 1, wherein said dielectric spacer is affixed to a surface of said flexible electrode.

11. The variable area capacitor of claim 1, wherein said dielectric spacer is affixed to a surface of said rigid electrode.

12. The variable area capacitor of claim 1, further comprising a support body with said surface contour with said support body bonded to a perimeter of said flexible electrode.

13. A variable area capacitor comprising:
   a. a flexible electrode responsive to a physical effect;
   b. a rigid electrode with a surface contour facing said flexible electrode;
   c. a dielectric spacer sandwiched between said rigid electrode and said flexible electrode that extends at least up to an inflection point of said surface contour;
   d. said dielectric spacer maintains a substantially fixed capacitance spacing between regions of mutually opposed areas of said rigid electrode and said flexible electrode, said regions of said fixed capacitance spacing increasing in extent as said flexible electrode deflects in response to said physical effect.

14. The variable area capacitor of claim 13 wherein a generatrix of said flexible electrode is determined primarily by bending stresses.

15. The variable area capacitor of claim 13 wherein one of a plurality of capacitance response characteristics are selected from a group consisting of a linear, nonomial, polynomial, exponential, and logarithmic response characteristic.

16. The variable area capacitor of claim 13, further comprising an insulative support body with said surface contour on which is deposited a conducting film electrode.

17. The variable area capacitor of claim 13 further comprising said rigid electrode with a central aperture.

18. The variable area capacitor of claim 13 wherein said flexible electrode is a diaphragm with an integral support rim.

19. The variable area capacitor of claim 13, wherein said flexible electrode is a diaphragm with a central proof mass.

20. The variable area capacitor of claim 13 wherein said flexible electrode comprises a conducting film adhered to a flexible electrically insulative material selected from a group consisting of glass, fused silica, quartz, sapphire, intrinsic silicon, PMMA, epoxy, moldable plastics, thermoplastics, and thermoset plastics.

21. The variable area capacitor of claim 13 wherein said rigid electrode comprises a conductive film deposited on said predetermined surface contour of a material selected from a group consisting of glass, fused silica, quartz, sapphire, intrinsic silicon, PMMA, epoxy, moldable plastics, thermoplastics, and thermoset plastics.

22. The variable area capacitor of claim 13, wherein said dielectric spacer is affixed to a surface of said flexible electrode facing said rigid electrode.

23. The variable area capacitor of claim 13, wherein said dielectric spacer is affixed to said rigid electrode.

24. The variable area capacitor of claim 13, further comprising a support body with said surface contour with said support body bonded to the perimeter of said flexible electrode.

25. A variable area capacitor constructed to avoid a saturation-type of nonlinear capacitance response comprising:
   a. a flexible electrode responsive to a physical effect;
   b. a rigid electrode with a surface contour facing said flexible electrode;
   c. a dielectric spacer sandwiched between said rigid electrode and said flexible electrode;
   d. said dielectric spacer maintains a substantially fixed capacitance spacing between regions of mutually opposed areas of said rigid electrode and said flexible electrode, said regions of said fixed capacitance spacing increasing in extent as said flexible electrode deflects in response to said physical effect;
   e. said surface contour having a shape that provides an increase in said regions of said fixed capacitive spacing at least up to an inflection point on said surface contour, whereby said capacitance response of said variable area capacitor is prevented from reaching a level of saturation.

26. The variable area capacitor of claim 25 wherein a generatrix of said flexible electrode is determined primarily by bending stresses.

27. The variable area capacitor of claim 25 wherein one of a plurality of capacitance response characteristics functions are selected from a group consisting of a linear, nonomial, polynomial, exponential, and a logarithmic response characteristic.

28. The variable area capacitor of claim 25, further comprising an insulative support body with said surface contour on which is deposited a conducting film electrode.

29. The variable area capacitor of claim 25 further comprising said rigid electrode with a central aperture.

30. The variable area capacitor of claim 25 wherein said flexible electrode is a diaphragm with an integral support rim.

31. The variable area capacitor of claim 25, wherein said flexible electrode is a diaphragm with a central proof mass.

32. The variable area capacitor of claim 25 wherein said flexible electrode comprises a conducting film adhered to a flexible electrically insulative material selected from a group consisting of glass, fused silica, quartz, sapphire, intrinsic silicon, PMMA, epoxy, moldable plastics, thermoplastics, and thermoset plastics.

33. The variable area capacitor of claim 25 wherein said rigid electrode comprises a conductive film deposited on said surface contour of a material selected from a group consisting of glass, fused silica, quartz, sapphire, intrinsic silicon, PMMA, epoxy, moldable plastics, thermoplastics, and thermoset plastics.

34. The variable area capacitor of claim 25, wherein said dielectric spacer means is affixed to a surface of said flexible electrode facing said rigid electrode.

35. The variable area capacitor of claim 25, wherein said dielectric spacer means is affixed to said rigid electrode.

36. The variable area capacitor of claim 25, further comprising a support body with said surface contour with said support body bonded to a perimeter of said flexible electrode.

* * * * *